US012721172B2

(12) United States Patent
Kim et al.

(10) Patent No.: US 12,721,172 B2
(45) Date of Patent: Aug. 25, 2026

(54) DISPLAY DEVICE AND METHOD FOR MANUFACTURING THE SAME

(71) Applicant: SAMSUNG DISPLAY CO., LTD., Yongin-si (KR)

(72) Inventors: Hong Am Kim, Yongin-si (KR); Kyung Mok Lee, Yongin-si (KR); Young Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 486 days.

(21) Appl. No.: 18/356,532

(22) Filed: Jul. 21, 2023

(65) Prior Publication Data

US 2024/0204148 A1 Jun. 20, 2024

(30) Foreign Application Priority Data

Dec. 19, 2022 (KR) ........................ 10-2022-0177744

(51) Int. Cl.

| | |
|---|---|
| ***H10W 42/00*** | (2026.01) |
| ***C09J 7/00*** | (2018.01) |
| ***H10H 29/14*** | (2025.01) |
| ***H10H 29/80*** | (2025.01) |
| ***H10H 29/85*** | (2025.01) |
| ***H10K 59/10*** | (2023.01) |

(Continued)

(52) U.S. Cl.

CPC ............... *H10W 42/00* (2026.01); *C09J 7/00* (2013.01); *H10H 29/14* (2025.01); *H10H 29/80* (2025.01); *H10H 29/8506* (2025.01); *H10H 29/857* (2025.01); *H10K 59/82* (2023.02); *H10W 40/70* (2026.01); *C09J 2203/326* (2013.01); *C09J 2301/10* (2020.08); *H10H 29/858* (2025.01); *H10K 59/10* (2023.02); *H10K 77/111* (2023.02); *H10W 40/233* (2026.01); *H10W 40/235* (2026.01); *H10W 40/251* (2026.01)

(58) Field of Classification Search

CPC ............. H10H 20/8506; H10H 20/857; H10H 20/0364; H10H 20/858; H10H 20/8581; H10H 20/8582; H10H 29/0365; H10K 77/111; H05K 1/028; H05K 2201/09072

See application file for complete search history.

(56) References Cited

U.S. PATENT DOCUMENTS

2013/0341597 A1* 12/2013 Kim ..................... H10K 59/131 257/40
2014/0307396 A1* 10/2014 Lee .................. G02F 1/133305 29/830

(Continued)

FOREIGN PATENT DOCUMENTS

KR 10-2008-0018722 2/2008
KR 10-2014-0000787 1/2014

(Continued)

*Primary Examiner* — Ratisha Mehta
*Assistant Examiner* — Adam Joseph Mott
(74) *Attorney, Agent, or Firm* — F. CHAU & ASSOCIATES, LLC

(57) ABSTRACT

Provided is a display device and a method for manufacturing the same. A display device includes, a display panel, a driving chip attached onto the display panel, a printed circuit board attached onto the display panel and including an opening exposing the driving chip, and a cover tape at least partially covering each of the display panel, the driving chip, and the printed circuit board.

20 Claims, 26 Drawing Sheets

(51) Int. Cl.

| | |
|---|---|
| ***H10K 59/82*** | (2023.01) |
| ***H10W 40/70*** | (2026.01) |
| *H10K 77/10* | (2023.01) |
| *H10W 40/20* | (2026.01) |
| *H10W 40/25* | (2026.01) |

(56) References Cited

U.S. PATENT DOCUMENTS

| | | | | |
|---|---|---|---|---|
| 2018/0069067 | A1* | 3/2018 | Oh | H10K 59/131 |
| 2020/0192431 | A1* | 6/2020 | Shin | G06F 1/1626 |
| 2020/0348722 | A1* | 11/2020 | Lee | H01L 23/552 |
| 2022/0020823 | A1* | 1/2022 | Kim | H10K 59/871 |
| 2025/0212626 | A1* | 6/2025 | Yang | H05K 1/11 |

FOREIGN PATENT DOCUMENTS

| | | | | | |
|---|---|---|---|---|---|
| KR | 20140000787 | A | * | 1/2014 | H10K 59/00 |
| KR | 10-2018-0028081 | | | 3/2018 | |
| KR | 20180028081 | A | * | 3/2018 | G02F 1/13452 |
| KR | 10-1991892 | | | 6/2019 | |
| KR | 10-2019-0135811 | | | 12/2019 | |
| KR | 10-2020-0127087 | | | 11/2020 | |
| KR | 20200127087 | A | * | 11/2020 | G02F 1/1345 |
| KR | 10-2351372 | | | 1/2022 | |
| KR | 10-2396181 | | | 5/2022 | |

* cited by examiner

DISPLAY DEVICE AND METHOD FOR MANUFACTURING THE SAME

CROSS-REFERENCE TO RELATED APPLICATION

This application claims priority from Korean Patent Application No. 10-2022-0177744 filed on Dec. 19, 2022, in the Korean Intellectual Property Office, and all the benefits accruing therefrom under 35 U.S.C. 119, the contents of which in its entirety are herein incorporated by reference.

BACKGROUND

1. Technical Field

The present disclosure relates to a display device and a method for manufacturing the same.

2. Description of the Related Art

As an information society develops, the demand for a display device for displaying an image is increasing in various forms. For example, the display device has been applied to various electronic devices such as smartphones, digital cameras, laptop computers, navigation devices, and smart televisions. The display devices may be flat panel display devices such as liquid crystal display devices, field emission display devices, or organic light emitting display devices. Among the flat panel display devices, the light emitting display device may include a light emitting element in which each of the pixels of a display panel may emit light by itself, thereby displaying an image without a backlight unit providing the light to the display panel.

A driving chip for driving light emitting elements in the display device may be mounted on the display panel. Various methods may be used to directly mount a chip on the display panel, or a printed circuit board (PCB) can serve as an intermediate medium.

SUMMARY

Aspects of the present disclosure provide a method for manufacturing a display device having an expanded vacuum adsorption area during a bending process.

Aspects of the present disclosure also provide a display device capable of minimizing impact on a pad portion and preventing a phenomenon in which a printed circuit board is detached from a display panel during a bending process, and a method for manufacturing the same.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a display device includes, a display panel, a driving chip attached onto the display panel, a printed circuit board attached onto the display panel and including an opening exposing the driving chip, and a cover tape at least partially covering each of the display panel, the driving chip, and the printed circuit board.

The cover tape is attached to at least a partial area of the display panel and at least a partial area of the printed circuit board.

The printed circuit board includes a first area positioned on one side of the opening and a second area positioned on the other side of the opening in a first direction, and the cover tape is attached to at least a portion of the first area and at least a portion of the second area.

The cover tape covers the driving chip.

The cover tape includes a first cover portion extending in the first direction, and a second cover portion protruding from the first cover portion in a second direction intersecting the first direction, the printed circuit board includes a first exposure area and a second exposure area on opposite sides of the second cover portion in the first direction, wherein portions of the printed circuit board in the first exposure area and the second exposure area adjacent to the cover tape are exposed.

The first cover portion includes a first adhesive portion directly attached to the printed circuit board and a second adhesive portion directly attached to the display panel.

An end portion of the display panel protrudes to a side in the second direction compared to a boundary between the first cover portion and the second cover portion.

The display device further comprises a residue film disposed on the first exposure area and the second exposure area.

The residue film is formed by detaching a liner configured to be attached onto the printed circuit board.

The liner includes a first portion extending in the first direction and a second portion protruding from the first portion in the second direction, and the second portion is configured to be in direct contact with the printed circuit board on the first exposure area and the second exposure area.

The display device further comprises a resin layer disposed within the opening to surround upper and side surfaces of the driving chip, wherein an upper surface of the resin layer covers the upper surface of the driving chip, and is coplanar with an upper surface of the printed circuit board.

The display panel further includes a first pad portion extending in a first direction and connected to the printed circuit board, and the printed circuit board is configured to be spaced apart from the display panel in an overlapping area overlapping the display panel on one side of the first pad portion with respect to a second direction intersecting the first direction.

An end portion of the printed circuit board protrudes more than an end portion of the display panel in the second direction.

The display panel includes a bending area and a pad area disposed on one side of the bending area and including the first pad portion, and an end portion on one side of the cover tape in the second direction is positioned on the pad area.

According to an aspect of the present disclosure, a display device comprises, a display panel, a flexible film attached onto the display panel, a driving chip attached onto the flexible film, a printed circuit board attached onto the flexible film and including an opening exposing the driving chip, and a cover tape at least partially covering each of the flexible film, the driving chip, and the printed circuit board.

The cover tape is attached to at least a partial area of the flexible film and at least a partial area of the printed circuit board, the printed circuit board includes a first area positioned on one side of the opening and a second area positioned on the other side of the opening in a first direction, and the cover tape is attached to at least a portion of the first area and at least a portion of the second area.

The cover tape includes a first cover portion extending in the first direction, and a second cover portion protruding from the first cover portion in a second direction intersecting the first direction, the printed circuit board includes a first exposure area and a second exposure area disposed on one side and the other side of the second cover portion in the first direction, respectively, and not covered by the cover tape, and the first exposure area and the second exposure area are disposed adjacent to the first cover portion in the second direction, respectively.

The first cover portion includes a first adhesive portion directly attached to the printed circuit board and a second adhesive portion directly attached to the flexible film, and an end portion on one side of the flexible film in the second direction protrudes more than a boundary between the first cover portion and the second cover portion.

The display device further comprises a residue film disposed on the first exposure area and the second exposure area, wherein the residue film is formed by detaching a liner configured to be attached onto the printed circuit board.

According to an aspect of the present disclosure, a method for manufacturing a display device comprises, providing a display panel on which a driving chip and a printed circuit board including an opening exposing the driving chip are mounted, a cover tape at least partially covering each of the display panel, the driving chip, and the printed circuit board, and a liner configured to be attached onto the printed circuit board, and bending the display panel using a vacuum adsorption pad that is in direct contact with the cover tape and the liner.

According to the display device and the method for manufacturing the same according to the embodiments of the present disclosure, a vacuum adsorption area may be expanded during a bending process.

According to the display device and the method for manufacturing the same according to the embodiments of the present disclosure, during the bending process, impact on the pad portion may be minimized, and the phenomenon in which the printed circuit board is detached from the display panel may be prevented.

However, the effects of the embodiments are not restricted to the one set forth herein. The above and other effects of the embodiments will become more apparent to one of daily skill in the art to which the embodiments pertain by referencing the claims.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION OF THE EMBODIMENTS

The invention will now be described more fully hereinafter with reference to the accompanying drawings, in which embodiments of the invention are shown. The inventive principles may, however, be embodied in different forms and should not be construed as limited to the embodiments set forth herein. Rather, these embodiments are provided as examples of the scope of the invention to those skilled in the art.

It will also be understood that when a layer is referred to as being "on" another layer or substrate, it can be directly on the other layer or substrate, or intervening layers may also be present. The same reference numbers indicate the same components throughout the specification.

Hereinafter, various embodiments will be described with reference to the accompanying drawings.

Figure 1:
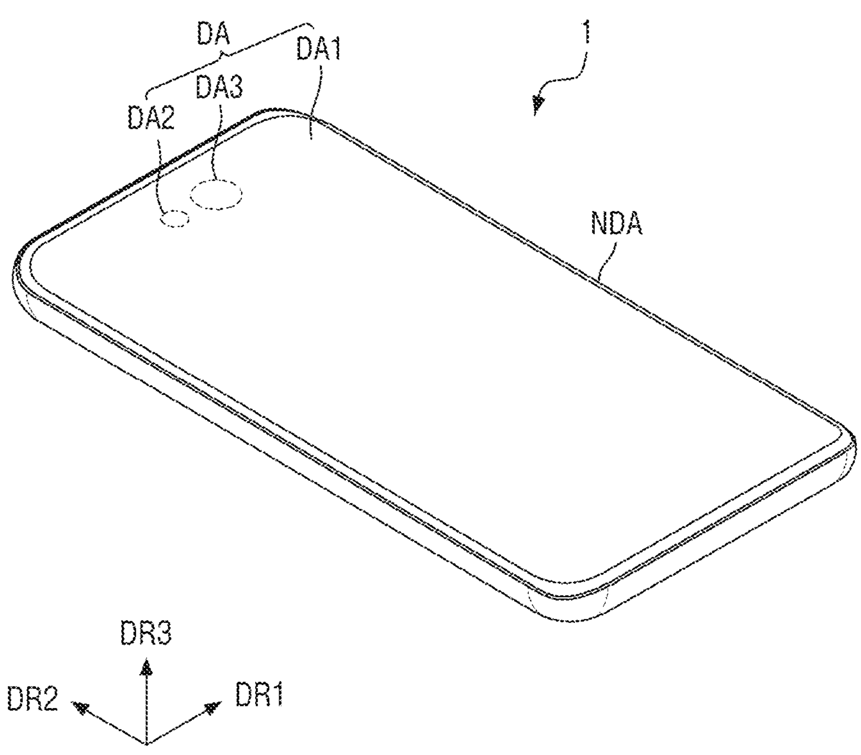
FIG. 1 is a schematic perspective view of an electronic device according to an embodiment.

FIG. 1 is a schematic perspective view of an electronic device according to an embodiment.

Referring to FIG. 1, an electronic device 1 displays a moving image or a still image. The electronic device 1 may refer to electronic devices that provide a display screen. For example, electronic device 1 may include televisions, laptop computers, monitors, billboards, Internet of things, mobile phones, smartphones, tablet personal computers (PCs), electronic watches, smartwatches, watch phones, head mounted displays, mobile communication terminals, electronic notebooks, electronic books, portable multimedia players (PMPs), navigation, game consoles, digital cameras, camcorders, and the like that provide the display screen.

The electronic device 1 may include a display device 10 (see FIG. 2) that provides a display screen. Examples of the display device may include an inorganic light emitting diode display device, an organic light emitting display device, a quantum dot light emitting display device, a plasma display device, and a field emission display device.

A shape of the electronic device 1 may be variously changed. For example, the electronic device 1 may have a shape such as a rectangle with a long width, a rectangle with a long length, a square, a quadrangle with rounded corners (vertices), other polygons, or a circle. A shape of a display area DA of the electronic device 1 may also be similar to an overall shape of the electronic device 1. In FIG. 1, the electronic device 1 having a rectangular shape with a long length in a second direction DR2 is illustrated.

In the illustrated drawing, the first direction DR1 and the second direction DR2 are horizontal directions and intersect each other. For example, the first direction DR1 and the second direction DR2 may be orthogonal to each other. In addition, the third direction DR3 may be a vertical direction intersecting the first direction DR1 and the second direction DR2, for example, orthogonal to the first direction DR1 and the second direction DR2. In the present specification, directions indicated by arrows in the first to third directions DR1, DR2, and DR3 may be referred to as one side, and the opposite direction thereof may be referred to as the other side.

The electronic device 1 may include a display area DA and a non-display area NDA. The display area DA is an area in which a screen may be displayed, and the non-display area NDA is an area in which a screen is not displayed. The display area DA may also be referred to as an active area, and the non-display area NDA may also be referred to as a non-active area. The display area DA may generally occupy the center of the electronic device 1.

The display area DA may include a first display area DA1, a second display area DA2, and a third display area DA3. The second display area DA2 and the third display area DA3, which are areas in which components for adding various functions to the electronic device 1 are disposed, may correspond to a component area.

Figure 2:
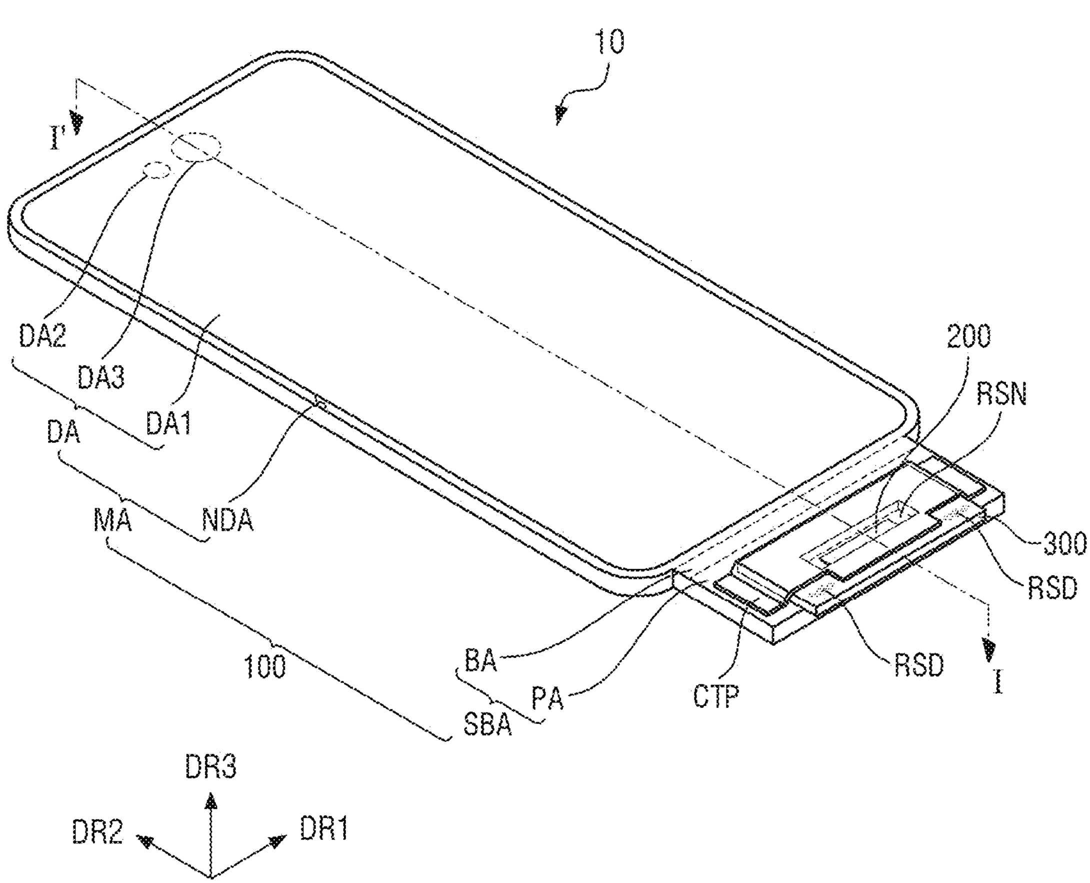
FIG. 2 is a perspective view illustrating a display device included in the electronic device according to an embodiment.
Figure 3:
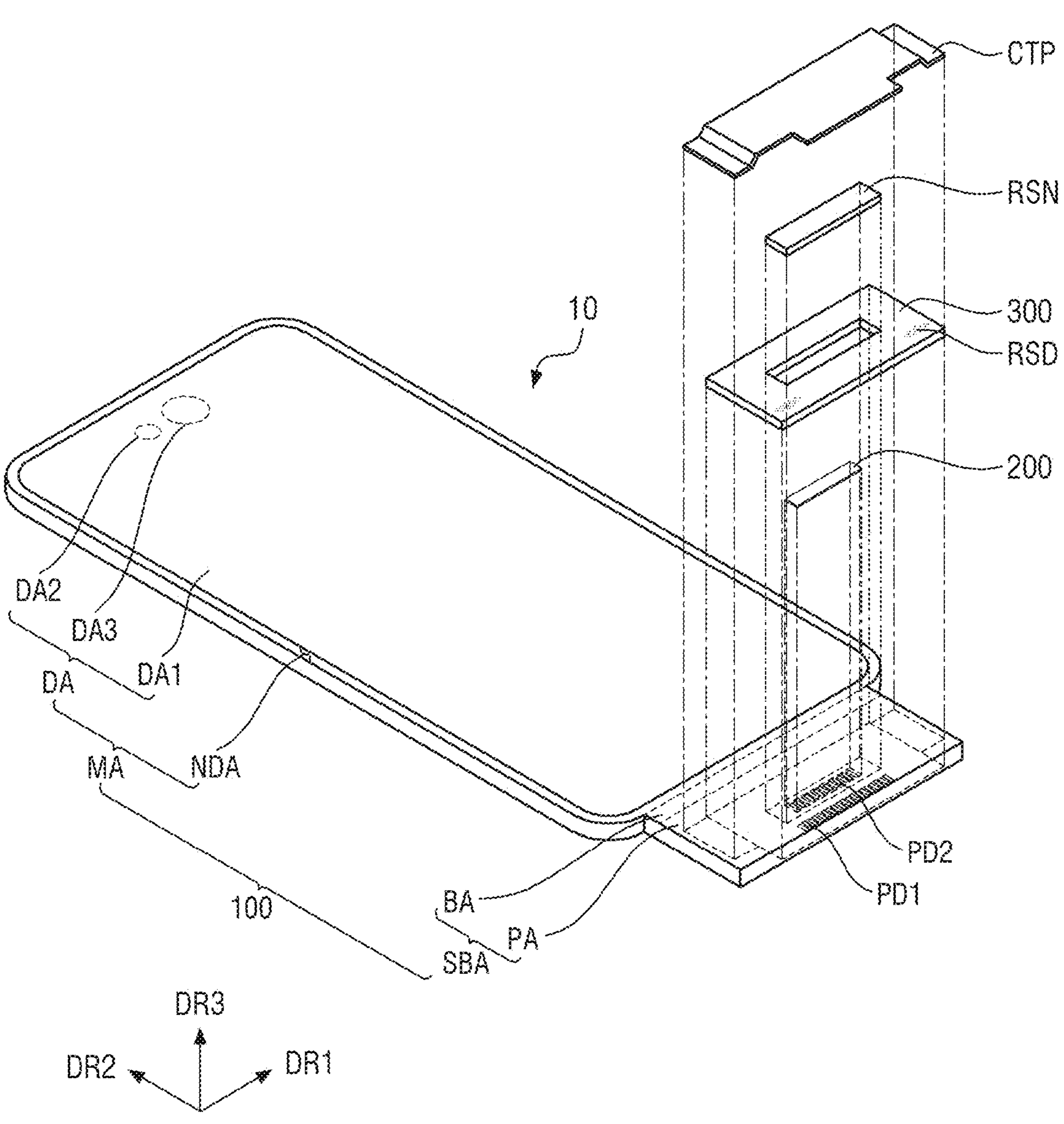
FIG. 3 is an exploded perspective view of the display device according to an embodiment.
Figure 4:
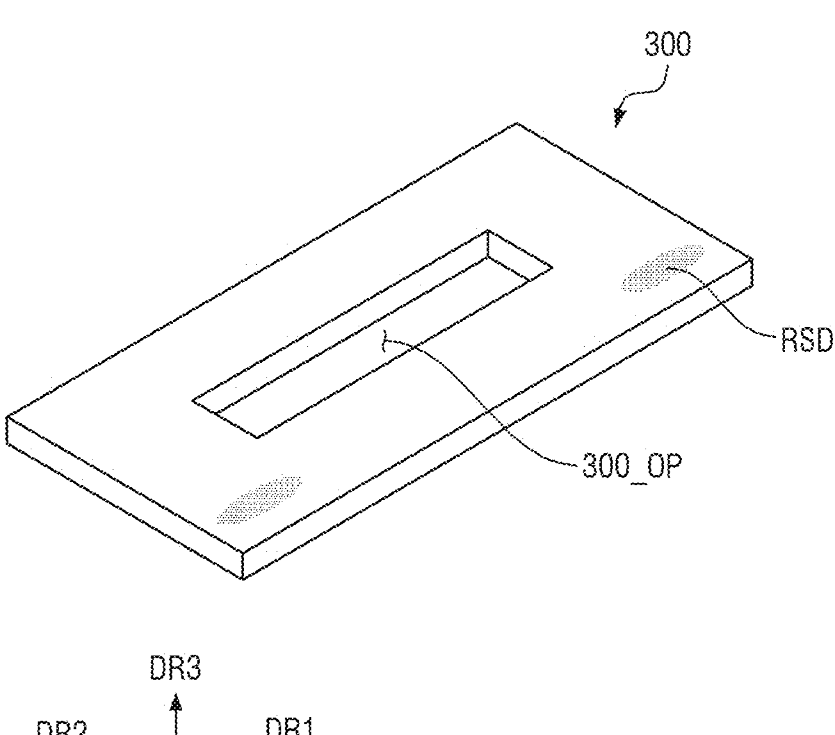
FIG. 4 is a schematic perspective view of a printed circuit board according to an embodiment.
Figure 5:
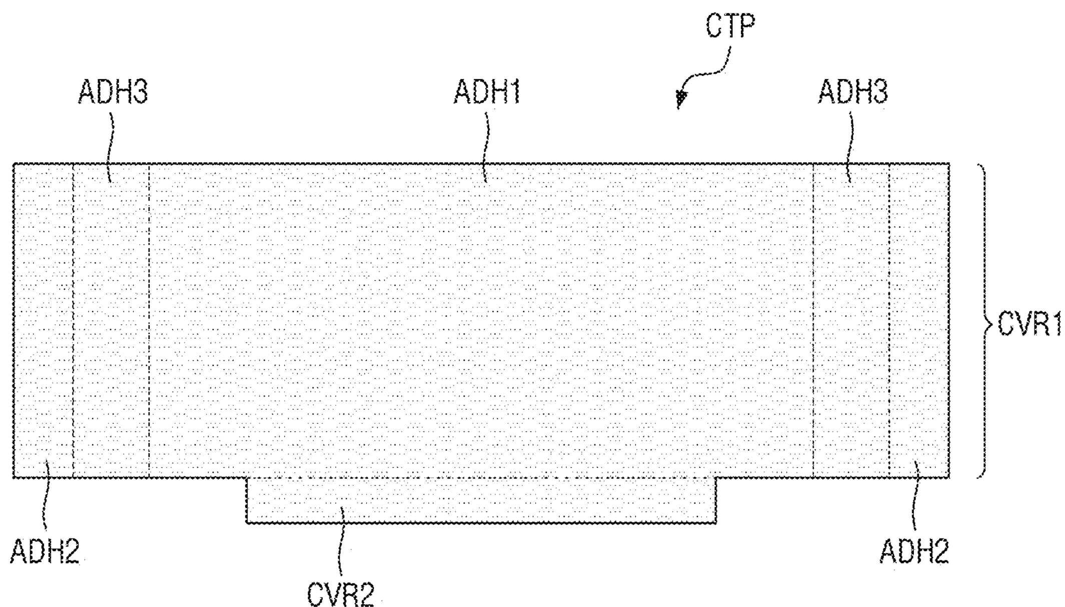
FIG. 5 is a schematic development view of a cover tape according to an embodiment.
Figure 5:
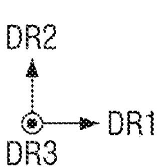

FIG. 2 is a perspective view illustrating a display device included in the electronic device according to an embodiment. FIG. 3 is an exploded perspective view of the display device according to an embodiment. FIG. 4 is a schematic perspective view of a printed circuit board according to an embodiment. FIG. 5 is a schematic development view of a cover tape according to an embodiment.

Referring to FIGS. 2 to 5, the electronic device 1 according to an embodiment may include a display device 10. The display device 10 may provide a screen displayed by the electronic device 1. The display device 10 may have a planar shape similar to that of the electronic device 1. For example, the display device 10 may have a shape similar to a rectangle having a short side in a first direction DR1 and a long side in a second direction DR2. A corner where the short side in the first direction DR1 and the long side in the second direction DR2 meet may be rounded to have a predetermined curvature, but is not limited thereto and may also be formed at a right angle. The planar shape of the display device 10 is not limited to the quadrangle, and may be formed similarly to other polygons, circles, or ovals.

The display device 10 may include a display panel 100, a driving chip 200, a printed circuit board 300, a resin layer RSN, and a cover tape CTP.

The display panel 100 may include a main area MA and a sub-area SBA.

The main area MA may include a display area DA including pixels displaying an image, and a non-display area NDA disposed around the display area DA. The display area DA may include a first display area DA1, a second display area DA2, and a third display area DA3. The display area DA may emit light generated by a self-light emitting element from a plurality of light emitting areas or a plurality of opening areas.

The self-light emitting element may be a light emitting diode (LED), which can include at least one of an organic light emitting diode (OLED) including an organic light emitting layer, a quantum dot LED (QLED) including a quantum dot light emitting layer, an inorganic LED including an inorganic semiconductor, and a micro LED, but is not limited thereto.

The non-display area NDA may be an area outside the display area DA. The non-display area NDA may be defined as an edge area of the main area MA of the display panel 100. The non-display area NDA may include a gate driving unit supplying gate signals to gate lines, and fan-out lines connecting the driving chip 200 and the display area DA.

The sub-area SBA may be an area extending from one side of the main area MA. The sub-area SBA may include a bending area BA and a pad area PA. The bending area BA can provide flexibility to a portion of the display panel 100.

The bending area BA may include a flexible material that may be bent, folded, rolled, or the like. For example, when the bending area BA is bent, at least a portion of the bending area BA and the pad area PA may overlap the main area MA in a thickness direction (a third direction DR3), where the flexibility can be sufficient to allow the pad area PA to be positioned above and facing the main area MA. The bending area BA may be reversibly, plasticly deformed, such that the pad area PA remains in a position established by bending the bending area BA.

The pad area PA may include pad portions connected to the printed circuit board 300 and the driving chip 200, respectively. As an example, the printed circuit board 300 may be connected to the display panel 100 through a first pad portion PD1, and the driving chip 200 may be connected to the display panel 100 through a second pad portion PD2.

The driving chip 200 may output signals and voltages for driving the display panel 100. The driving chip 200 may supply data voltages to data lines (not illustrated). The driving chip 200 may supply a power voltage to a power line and may supply a gate control signal to a gate driving unit.

The driving chip 200 may be physically and electrically connected to the display panel 100 through the second pad portion PD2, where the second pad portion PD2 can be configured to electrically connect to the driving chip 200. The driving chip 200 may be formed as an integrated circuit (IC) and mounted on the display panel 100 by a chip on glass (COG) method, a chip on plastic (COP) method, or an ultrasonic bonding method. For example, the driving chip 200 may be disposed in the pad area PA of the sub-area SBA, and may be positioned to overlap the main area MA in the thickness direction by bending the bending area BA of the sub-area SBA.

The printed circuit board 300 may be physically and electrically connected to the display panel 100 through the first pad portion PD1. The printed circuit board 300 may be attached onto the first pad portion PD1 using an anisotropic conductive film (ACF). Lead lines of the printed circuit board 300 may be electrically connected to the pad portions of the display panel 100. The printed circuit board 300 may be a flexible film such as a flexible printed circuit board, a printed circuit board, or a chip on film.

The printed circuit board 300 may include a plurality of stacked structures. For example, the printed circuit board 300 may include a plurality of wiring layers, an insulating layer disposed between the wiring layers, and an organic protective layer disposed on upper and lower sides of the wiring layers.

The printed circuit board 300 may include an area overlapping the pad area PA of the display panel 100 in the third direction DR3 and a protruding area that does not directly overlap the pad area PA of the display panel 100. The protruding area of the printed circuit board 300 may extend beyond one or more edges of the pad area PA.

The area of the printed circuit board 300 overlapping the pad area PA in the third direction DR3 may directly overlap an upper surface of the display panel 100 in the third direction DR3, and the protruding area may not directly overlap the upper surface of the display panel 100. Here, "directly overlapping" may mean that the upper surface of the display panel 100 directly facing a lower surface of the printed circuit board 300 overlaps the printed circuit board 300, where a normal (ray) projected perpendicularly from the surface of the upper surface of the display panel 100 would intersect a portion of the printed circuit board 300.

The area of the printed circuit board 300 overlapping the pad area PA in the third direction DR3 may have a larger area than the protruding area. As an example, the printed circuit board 300 may be substantially disposed closer to the pad area PA with respect to the second direction DR2. The printed circuit board 300 may not overlap the bending area BA.

In some embodiments, the protruding area of the printed circuit board 300 may include a pad portion or a bypass wiring connected to an external device such as a central processing unit (CPU) or an application processor (AP).

Figure 6:
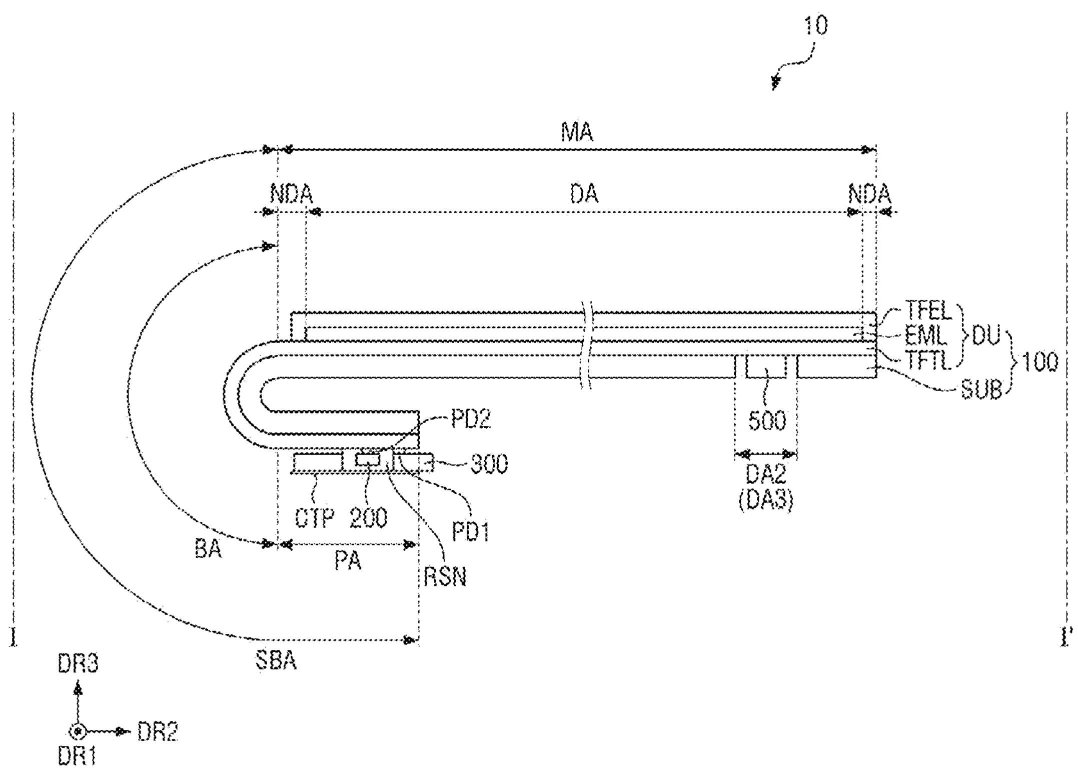
FIG. 6 is a cross-sectional view taken along line I-I' of FIG. 2.

In the display device 10 according to the present embodiment, as most of the printed circuit board 300 is disposed to overlap the pad area PA of the display panel 100, an overlapping length between the sub-area SBA position on the lower side of the display panel 100 and the main area MA positioned on the upper side of the display panel 100 in the third direction DR3 may be minimized when the display device 10 is bent as illustrated in FIG. 6. Through this, an area in which the sub-area SBA and the main area MA do not overlap in the third direction DR3 is widened, so that a mounting space of a battery or a panel lower member may be expanded.

Referring to FIG. 4, the printed circuit board 300 may include an opening 300_OP exposing the driving chip 200. An inner surface of the printed circuit board 300 positioned at a boundary of the opening 300_OP may surround the driving chip 200. In the drawing, a shape of the opening 300_OP is illustrated as a rectangular parallelepiped, but is not limited thereto, and the opening 300_OP may have a shape similar to that of the driving chip 200.

When the printed circuit board 300 according to the present embodiment is disposed to overlap the display panel 100, the display device 10 may include the opening 300_OP exposing the driving chip 200 to prevent interference with the driving chip 200. The opening 300_OP can be configured to be larger than the driving chip 200, where there can be a gap between the boundary of the opening 300_OP and the driving chip 200.

In some embodiments, the printed circuit board 300 may include a residue film RSD on an upper surface thereof. The residue film RSD may be formed by detachment of a liner LNR, which will be described later with reference to FIG. 13 and the like. The residue film RSD may include the same material as an adhesive layer disposed on a lower surface of the liner LNR. For example, the residue film RSD may include an acrylic-based adhesive material, a silicone-based adhesive material, a urethane-based adhesive material, an olefin-based adhesive material, or a styrene-based adhesive material. In various embodiments, the residue film RSD may include an acrylic-based adhesive material capable of easily adjusting adhesive strength.

The resin layer RSN may be disposed in the opening 300_OP. The resin layer RSN may be disposed to surround the upper and side surfaces of the driving chip 200. The resin layer RSN may completely cover the upper and side surfaces of the driving chip 200, where the resin layer RSN can be larger than the upper surface of the driving chip 200. An upper surface of the resin layer RSN can cover the upper surface of the driving chip 200 and be coplanar with an upper surface of the printed circuit board 300.

The resin layer RSN may be formed by filling the opening 300_OP with a resin material such as epoxy-based resin. The resin layer RSN may prevent permeation of moisture or foreign substances into the driving chip 200. The resin layer RSN may function as a heat dissipation layer that diffuses heat generated from the driving chip 200. As an example, the resin layer RSN may include a heat dissipating material such as graphite. However, the resin layer RSN is not limited thereto, and may include various known heat dissipating materials.

The cover tape CTP may be disposed on the display panel 100, the driving chip 200, and the printed circuit board 300. The cover tape CTP may at least partially cover each of the display panel 100, the driving chip 200, and the printed circuit board 300. The cover tape CTP may completely cover the driving chip 200.

The cover tape CTP may diffuse or dissipate heat generated from the driving chip 200 and the printed circuit board 300 to the outside. As an example, the cover tape CTP may be a kind of thermally conductive adhesive tape including a heat dissipating material or a phase change material PCM, where the cover tape CTP can be in thermal contact with the driving chip 200, either directly or through thermal contact with the resin layer RSN.

The cover tape CTP may prevent the driving chip 200 and the printed circuit board 300 from being damaged by an external force. The cover tape CTP may prevent static electricity from being generated in the driving chip 200 and the printed circuit board 300. As an example, the cover tape CTP may include a polyamide film, a PET film, or the like, where the cover tape CTP can have electrically conductive properties, as well as thermally conductive properties.

Referring to FIG. 5, the cover tape CTP may include a first cover portion CVR1 extending in the first direction DR1 and a second cover portion CVR2 protruding from the first cover portion CVR1 in the second direction DR2.

The first cover portion CVR1 may include a first adhesive portion ADH1, second adhesive portions ADH2 disposed on both sides of the first adhesive portion ADH1, and third adhesive portions ADH3 disposed between the first adhesive portion ADH1 and the second adhesive portions ADH2.

The first adhesive portion ADH1 may be directly attached to at least a partial area of the upper surface of the printed circuit board 300. The first adhesive portion ADH1 may also be directly attached to the upper surface of the resin layer RSN. The first adhesive portion ADH1 can be in physical contact with both the printed circuit board 300 and the resin layer RSN. The second adhesive portions ADH2 may be directly attached to at least a partial area of the upper surface of the display panel 100. The third adhesive portions ADH3 may be formed due to a height difference between the printed circuit board 300 and the upper surface of the display panel 100, where the third adhesive portions ADH3 can extend between the first adhesive portion ADH1 on the printed circuit board 300 and the second adhesive portions ADH2 on the upper surface of the display panel 100. The third adhesive portions ADH3 may also be attached to the side surface of the printed circuit board 300 or may also be spaced apart from the side surface of the printed circuit board 300.

The second cover portion CVR2 may protrude from at least a portion of the first cover portion CVR1 in the second direction DR2. The second cover portion CVR2 may be disposed on the first pad portion PD1 and may completely cover the first pad portion PD1. Portions of the cover tape CTP can be on three sides of the printed circuit board 300.

As the second cover portion CVR2 of the cover tape CTP according to the present embodiment completely covers the first pad portion PD1, the cover tape CTP may effectively diffuse heat generated from the first pad portion PD1.

FIG. 6 is a cross-sectional view taken along line I-I' of FIG. 2.

Referring to FIG. 6, the display panel 100 may include a substrate SUB and a display layer DU disposed on the substrate SUB. The display layer DU may include a thin film transistor layer TFTL, a light emitting element layer EML, and a thin film encapsulation layer TFEL.

The substrate SUB may be a base substrate or a base member. The substrate SUB may be a flexible substrate that may be bent, folded, rolled, or the like. For example, the substrate SUB may include a polymer resin such as polyimide PI, but is not limited thereto. In another embodiment, the substrate SUB may include a glass material or a metal material.

The thin film transistor layer TFTL may be disposed on the substrate SUB, where the thin film transistor layer TFTL can be on a first side of the substrate SUB. The thin film transistor layer TFTL may include a plurality of thin film transistors constituting a pixel circuit of pixels. The thin film transistor layer TFTL may further include gate lines, data lines, power lines, gate control lines, fan-out lines connecting the driving chip 200 and the data lines, and lead lines connecting the driving chip 200 and the first pad portion PD1. Each of the thin film transistors may include a semiconductor area, a source electrode, a drain electrode, and a gate electrode.

The light emitting element layer EML may be disposed on the thin film transistor layer TFTL, where the light emitting element layer EML can cover a portion of the thin film transistor layer TFTL. The light emitting element layer EML may include a plurality of light emitting elements including a first electrode, a second electrode, and a light emitting layer to emit light, and a pixel defining film defining pixels. The plurality of light emitting elements of the light emitting element layer EML may be disposed in the display area DA. The thin film transistor layer TFTL can separate the light emitting element layer EML from the substrate SUB.

The thin film encapsulation layer TFEL may cover an upper surface and side surfaces of the light emitting element layer EML, and may protect the light emitting element layer EML. The thin film encapsulation layer TFEL may include at least one inorganic film and at least one organic film for encapsulating the light emitting element layer EML. A portion of the thin film encapsulation layer TFEL along edges of the light emitting element layer EML can be in physical contact with the thin film transistor layer TFTL, where the thin film encapsulation layer TFEL extends along the side surfaces of the light emitting element layer EML. The portion of the thin film encapsulation layer TFEL along edges of the light emitting element layer EML can be in and form the non-display area NDA.

In some embodiments, the display device 10 may further include an optical device 500. The optical device 500 may be disposed in the second display area DA2 or the third display area DA3. The optical device 500 may emit or receive light in infrared, ultraviolet, and visible light bands. For example, the optical device 500 may be an optical sensor that detects light incident on the display device 10, such as a proximity sensor, an illuminance sensor, and a camera sensor or an image sensor.

In an embodiment, the substrate SUB of the display panel 100 may be bent in a lower direction of the substrate SUB in the bending area BA. When the substrate SUB of the display panel 100 is bent, the driving chip 200, the printed circuit board 300, the resin layer RSN, and the cover tape CTP disposed on the pad area PA may overlap the main area MA of the display panel 100 in the thickness direction, that is, in the third direction DR3. When the substrate SUB of the display panel 100 is bent, the driving chip 200, the printed circuit board 300, the resin layer RSN, and the cover tape CTP disposed on the pad area PA may face away from the first side of the substrate SUB, such that the driving chip 200, the printed circuit board 300 can be facing an opposite side from the display area DA.

Figure 7:
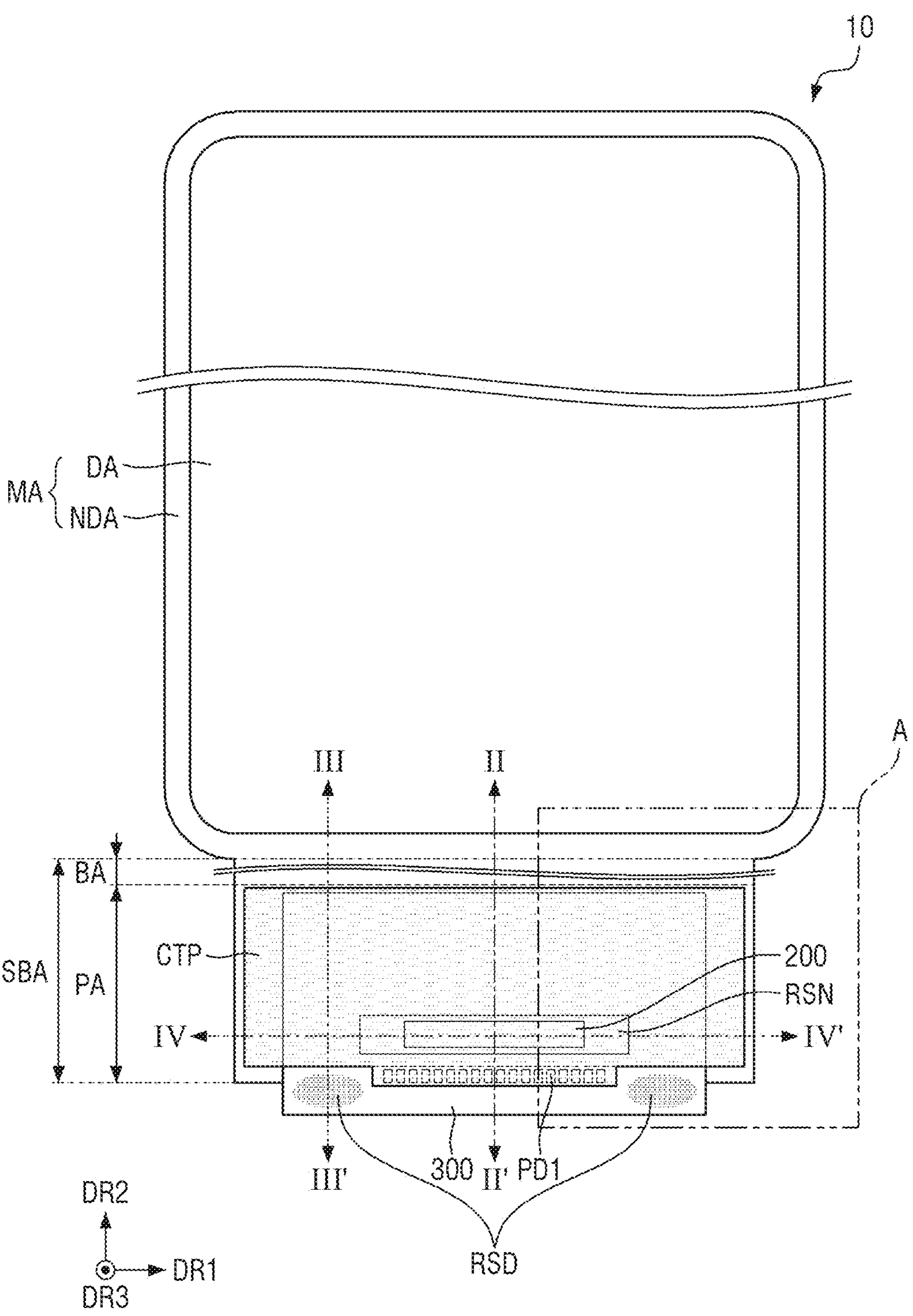
FIG. 7 is a plan view of the display device according to an embodiment viewed from the front.
Figure 8:
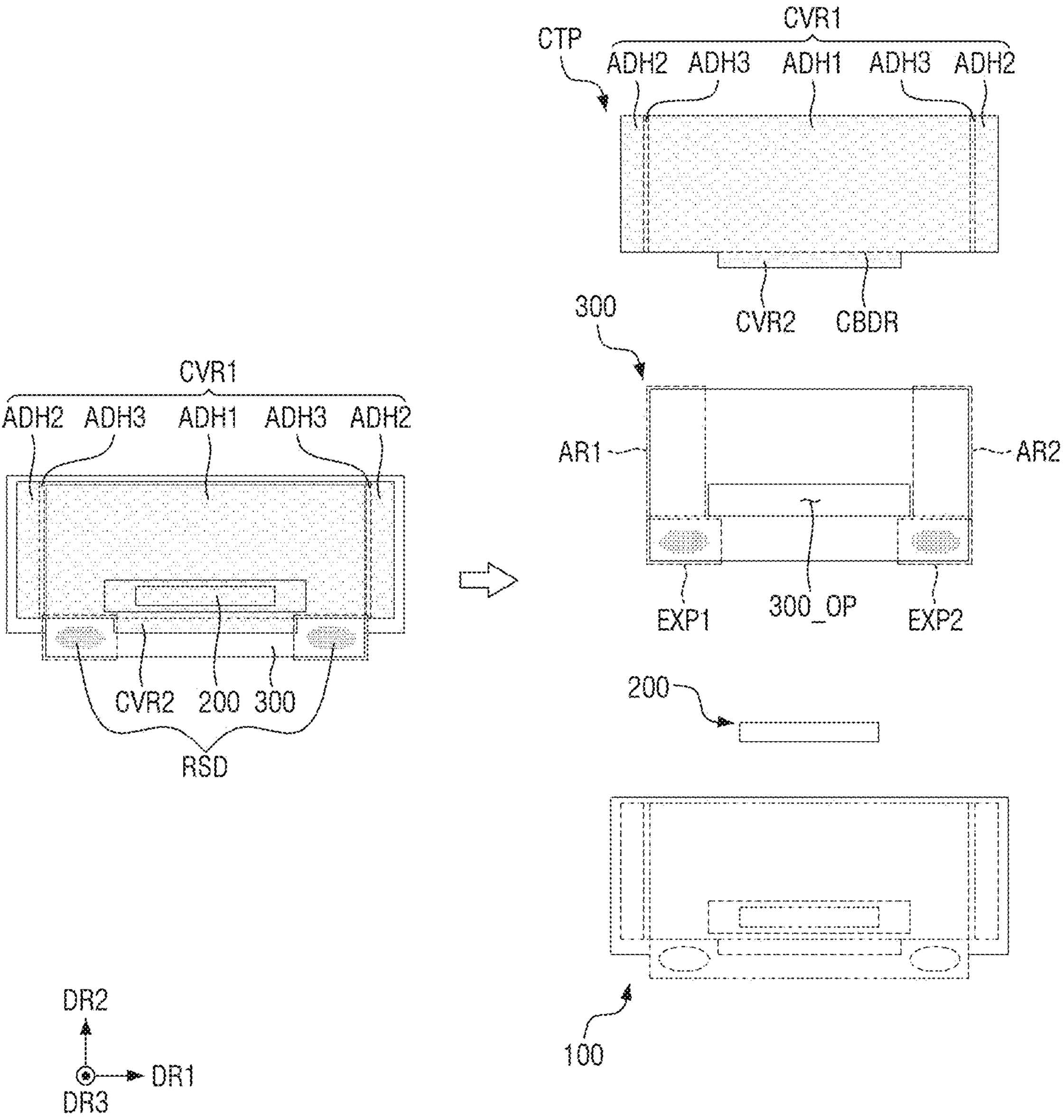
FIG. 8 is an exploded plan view illustrating an upper portion of a pad area of a display panel according to an embodiment.
Figure 9:
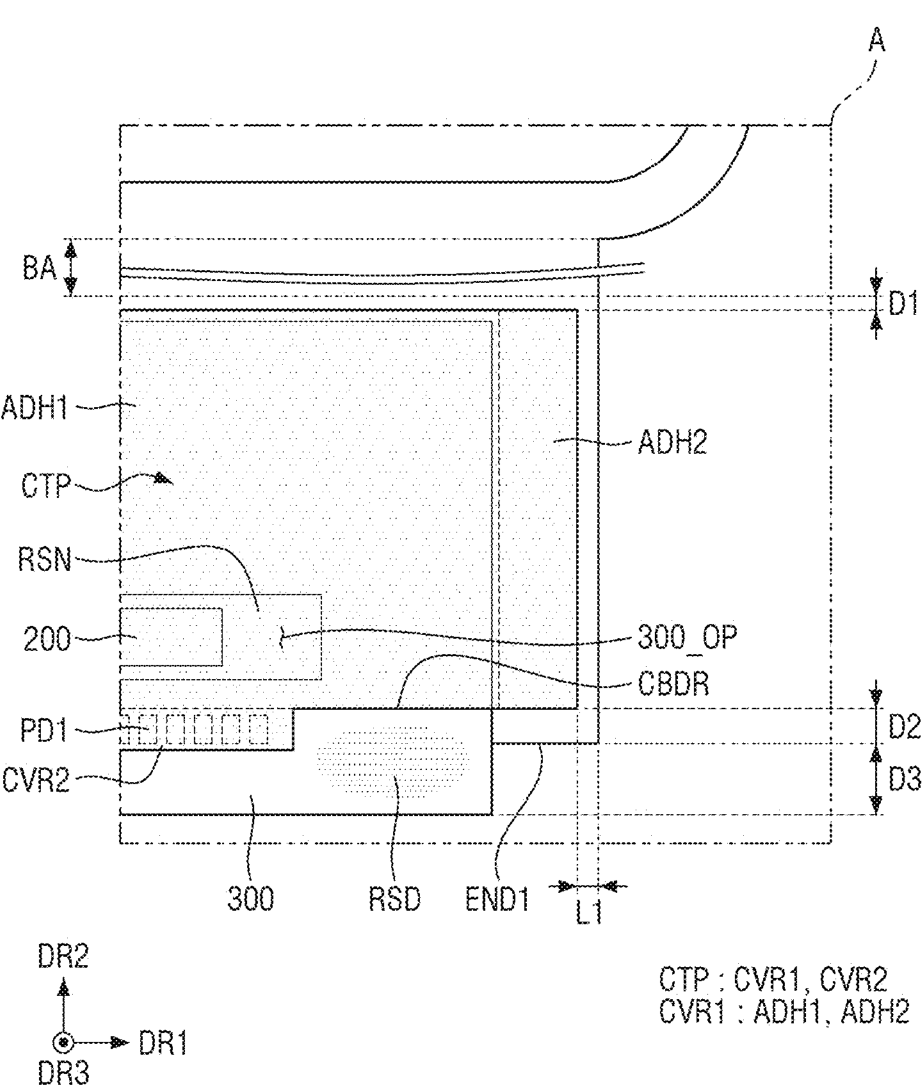
FIG. 9 is an enlarged view of part 'A' of FIG. 7.
Figure 10:
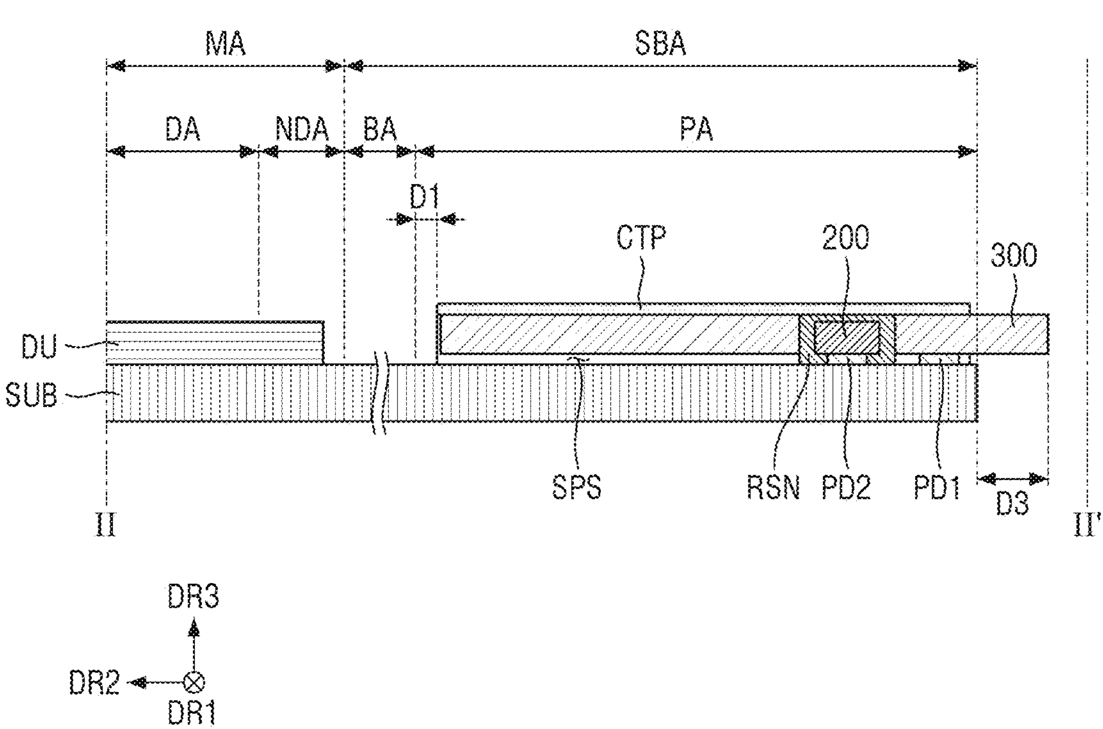
FIG. 10 is a cross-sectional view taken along line II-II' of FIG. 7.
Figure 11:
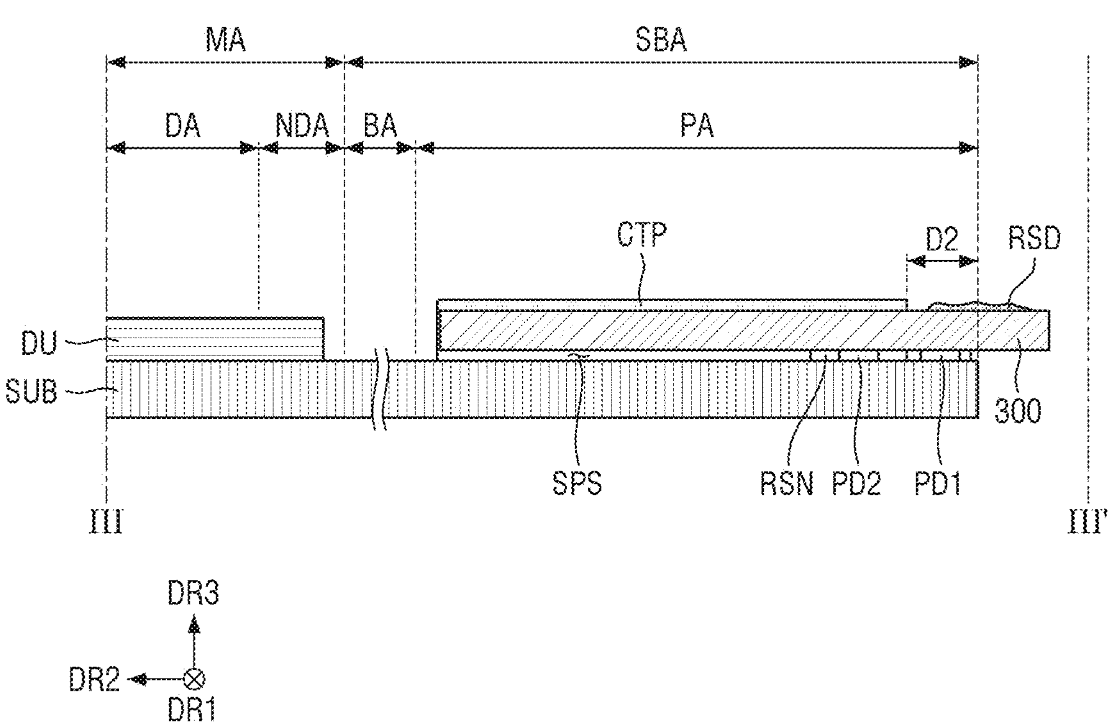
FIG. 11 is a cross-sectional view taken along line III-III' of FIG. 7.
Figure 12:
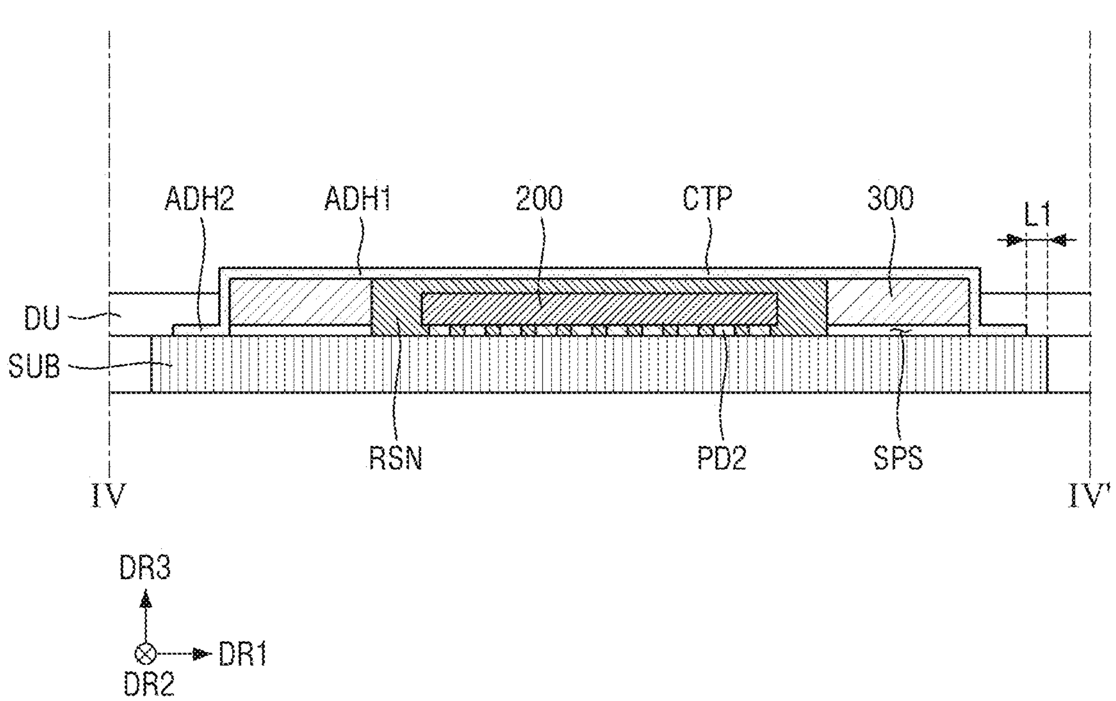
FIG. 12 is a cross-sectional view taken along line IV-IV' of FIG. 7.

FIG. 7 is a plan view of the display device according to an embodiment viewed from the front. FIG. 8 is an exploded plan view illustrating an upper portion of a pad area of a display panel according to an embodiment. FIG. 9 is an enlarged view of part 'A' of FIG. 7. FIG. 10 is a cross-sectional view taken along line II-II' of FIG. 7. FIG. 11 is a cross-sectional view taken along line III-III' of FIG. 7. FIG. 12 is a cross-sectional view taken along line IV-IV' of FIG. 7.

FIGS. 7 to 12 illustrate states in which the liner LNR (see FIG. 13) is removed after the display device 10 is bent. Although it is illustrated in the drawing that the substrate SUB is not bent, this is only for convenience of explanation, and those skilled in the art will be able to understand the technical idea or features of the present disclosure regardless of the states before and after bending of the display device 10.

Referring to FIGS. 7 and 8, the printed circuit board 300 may include a first area AR1 and a second area AR2 respectively positioned on opposite sides of the opening 300_OP with respect to the first direction DR1, where the first area AR1 is on one side of the opening 300_OP and the second area AR2 is on the other side of the opening 300_OP with respect to the first direction DR1. The first adhesive portion ADH1 of the first cover portion CVR1 of the cover tape CTP may be attached to at least a portion of the first area AR1 and at least a portion of the second area AR2.

The printed circuit board 300 may include a first exposure area EXP1 and a second exposure area EXP2 that are disposed on one side and the other side of the second cover portion CVR2 with respect to the first direction DR1 and not covered by the cover tape CTP, where the first exposure area EXP1 and a second exposure area EXP2 can be on opposite sides of the second cover portion CVR2. The first exposure area EXP1 can be on the same side of the printed circuit board 300 as the first area AR1, and the second exposure area EXP2 can be on the same side of the printed circuit board 300 as the second area AR2. The first exposure area EXP1 and the second exposure area EXP2 may overlap the first cover portion CVR1 in the second direction DR2, respectively. The first exposure area EXP1 and the second exposure area EXP2 may be disposed on one side of the first cover portion CVR1, respectively. The first exposure area EXP1 and the second exposure area EXP2 can provide exposed surfaces of the printed circuit board 300 adjacent to the cover tape CTP. A portion or a liner LNR may be placed in direct contact with the first exposure area EXP1 and the second exposure area EXP2 of the printed circuit board 300.

Referring to FIGS. 7 to 12, an end portion of the printed circuit board 300 adjacent to the bending area BA, i.e., an end portion on one side in the second direction DR2 may be spaced apart from a boundary between the bending area BA and the pad area PA by a first length D1 in plan view, as shown in FIGS. 9 and 10. The end portion of the printed circuit board 300 adjacent to the bending area BA may be positioned on the pad area PA. This is in consideration of the securing of the bending area BA of the display device 10 and an attachment tolerance of the cover tape CTP, and for example, the first length D1 may be 0.3 mm or more. The cover tape CTP may not extend into the bending area BA.

A boundary CBDR between the first cover portion CVR1 and the second cover portion CVR2 of the cover tape CTP may be spaced apart from an end portion END1 of the display panel 100 in the second direction DR2 by a second length D2. The end portion END1 of the display panel 100 may protrude in a direction opposite to the second direction DR2 compared to the boundary CBDR between the first cover portion CVR1 and the second cover portion CVR2 of the cover tape CTP. This is in consideration of an attachment tolerance of the liner LNR and an attachment tolerance of the cover tape CTP, and for example, the second length D2 may be 5.45 mm or more.

An end portion opposite to the end portion of the printed circuit board 300 adjacent to the bending area BA, that is, an end portion on the other side in the second direction DR2 may protrude by a third length D3 compared to the end portion on the other side of the display panel 100 in the second direction DR2. This is to secure a bypass space for circuit wiring mounted on the printed circuit board 300 and to secure a space for mounting the pad portion connected to an external device such as a central processing unit (CPU) or an application processor (AP), and for example, the third length D3 may be 6 mm or more.

An end portion of the cover tape CTP in the first direction DR1 may be spaced apart from an end portion of the pad area PA of the display panel 100 in the first direction DR1 by a first distance L1 in plan view. The end portion of the pad area PA of the display panel 100 in the first direction DR1 may protrude more than the end portion of the cover tape CTP in the first direction DR1. This is in consideration of the attachment tolerance of the cover tape CTP, and for example, the first distance L1 may be 0.3 mm or more.

The upper surface of the driving chip 200 may be positioned lower than the upper surface of the printed circuit board 300, as shown in FIG. 12. The resin layer RSN may cover the upper surface of the driving chip 200, and the upper surface of the resin layer RSN may be positioned higher than the upper surface of the driving chip 200. In an embodiment, the upper surface of the resin layer RSN may be positioned at the same height as the upper surface of the printed circuit board 300, where the upper surface of the resin layer RSN and the upper surface of the printed circuit board 300 can be coplanar. Through this, it is possible to compensate for a step due to a height difference between the driving chip 200 and the printed circuit board 300.

A separation space SPS may be formed in an overlapping area in which the printed circuit board 300 overlaps the display panel 100, including a substrate SUB and a display layer DU disposed on the substrate SUB, positioned on one side of the first pad portion PD1 in the second direction DR2, as shown in FIG. 11. In the overlapping area, the printed circuit board 300 may be configured to be freely physically spaced apart from the display panel 100.

As the first adhesive portion ADH1 is attached to the printed circuit board 300 and the second adhesive portions ADH2 are attached to the display panel 100, the cover tape CTP according to the present embodiment may prevent the printed circuit board 300 spaced apart from the display panel 100 in the overlapping area from moving away from the display panel 100, as shown in FIG. 8. Through this, it is possible to prevent the printed circuit board 300 from being separated from the display panel 100 due to gravity and moment of inertia during a bending process of the display device 10. In addition, damage applied to the first pad portion PD1 may be minimized by preventing the printed circuit board 300 from moving away from the display panel 100, as shown in FIG. 11.

The residue film RSD may be disposed in the first exposure area EXP1 and the second exposure area EXP2 described above with reference to FIG. 8, respectively. By securing the first exposure area EXP1 and the second exposure area EXP2 in the display device 10 according to the present embodiment, an attachment area of the liner LNR, which will be described later, may be secured.

Hereinafter, a display device in a state in which a liner is attached before a bending process of the display device will be described.

Figure 13:
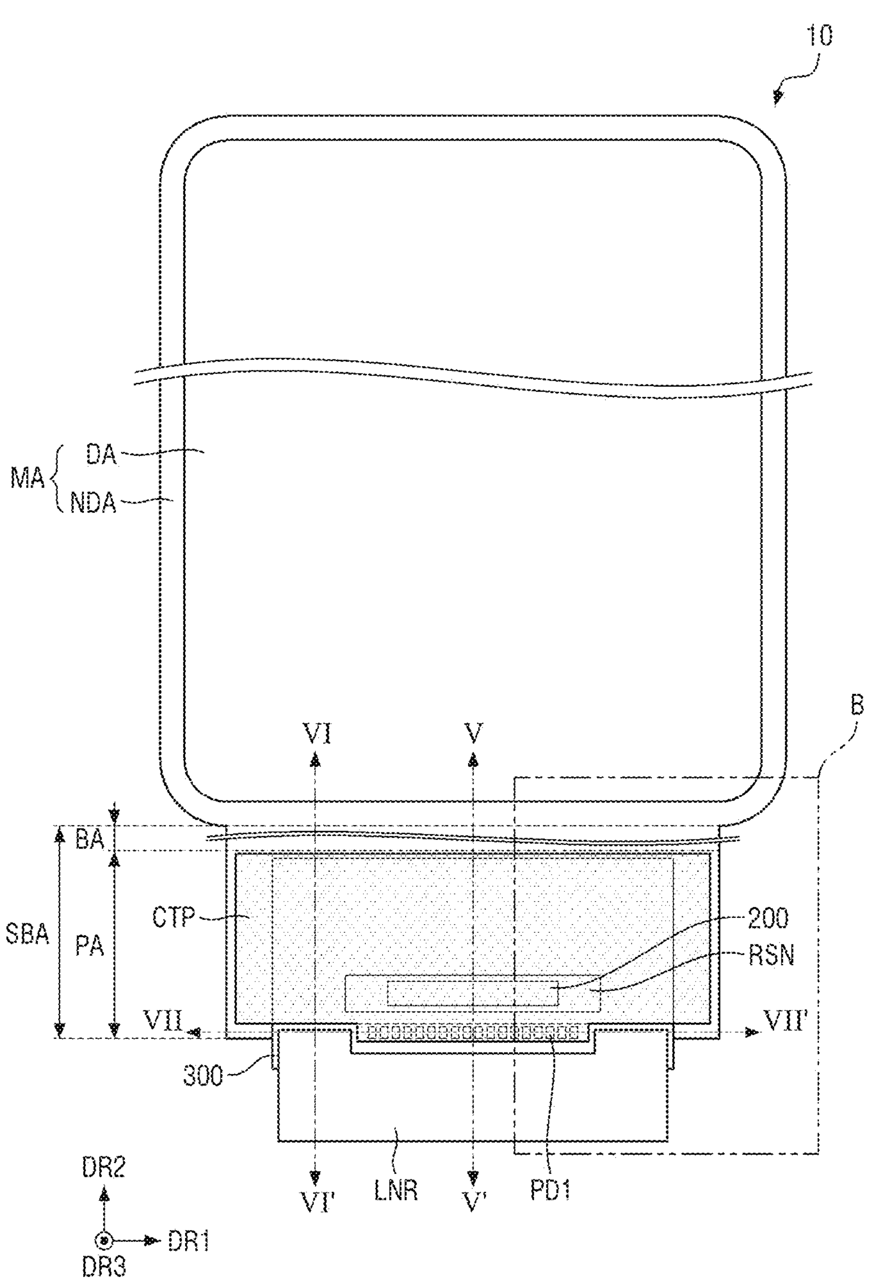
FIG. 13 is a plan view illustrating a state in which a liner is attached to the display device according to an embodiment.
Figure 14:
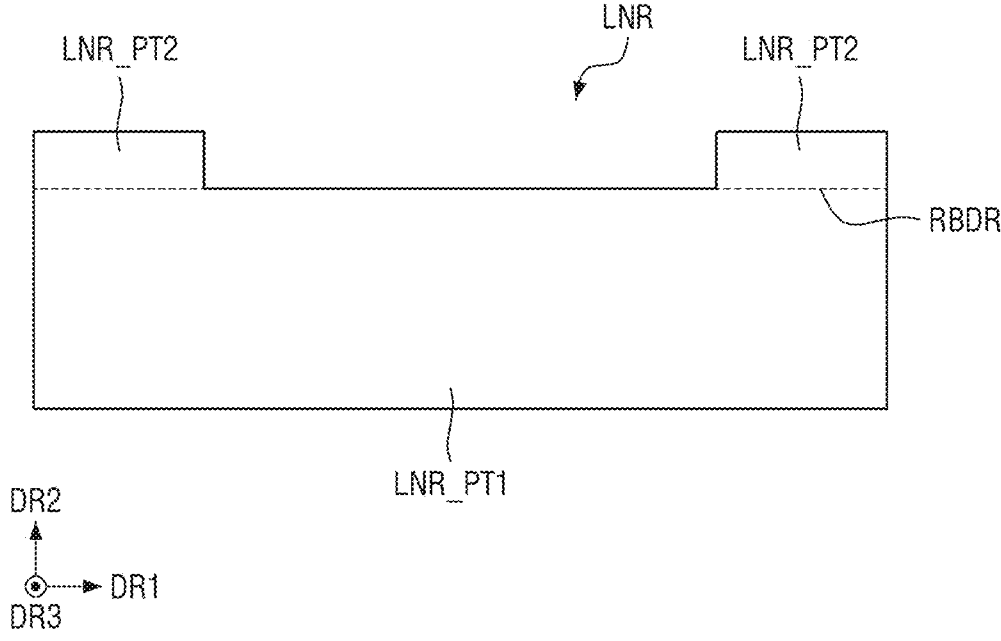
FIG. 14 is a schematic plan view of a liner according to an embodiment.
Figure 15:
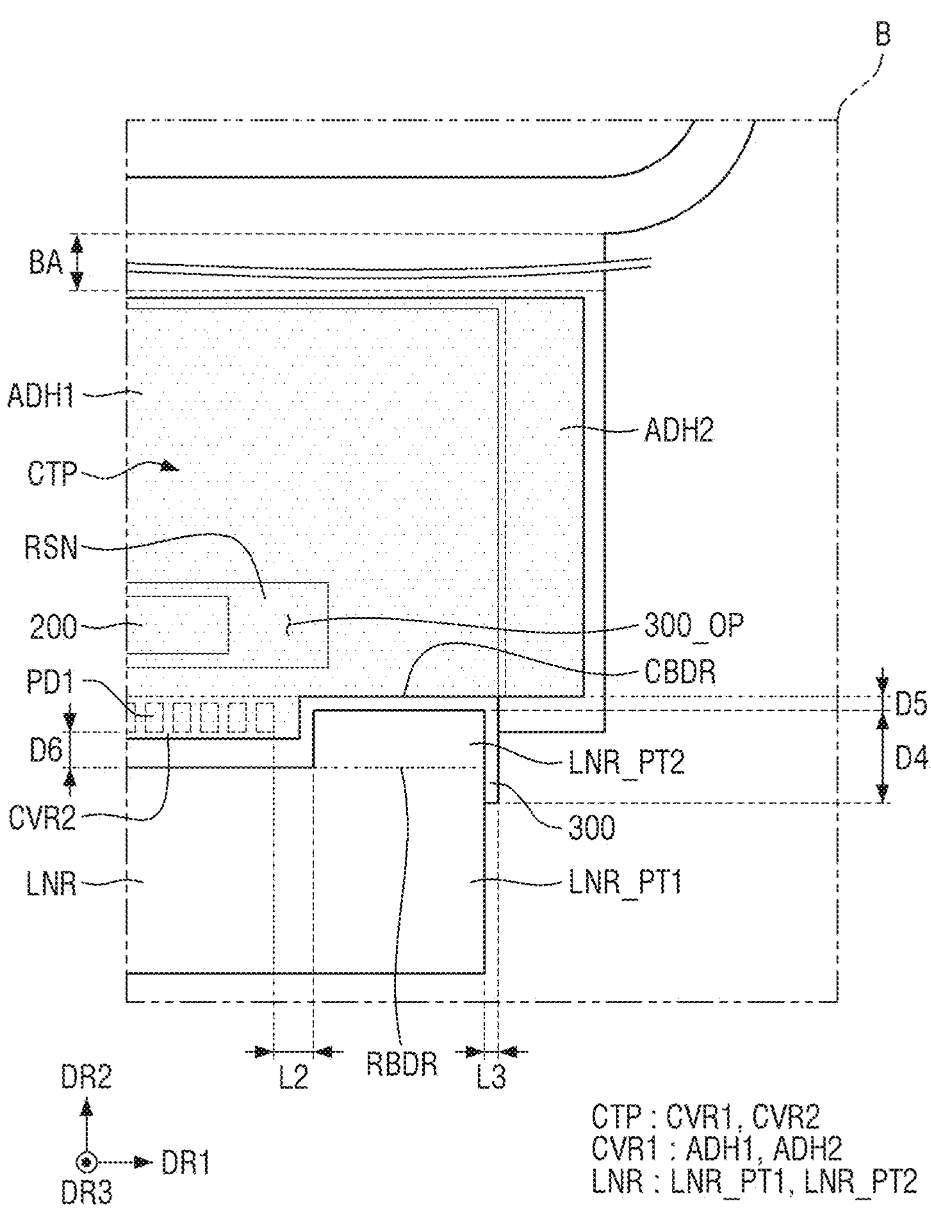
FIG. 15 is an enlarged plan view of part 'B' of FIG. 13.
Figure 16:
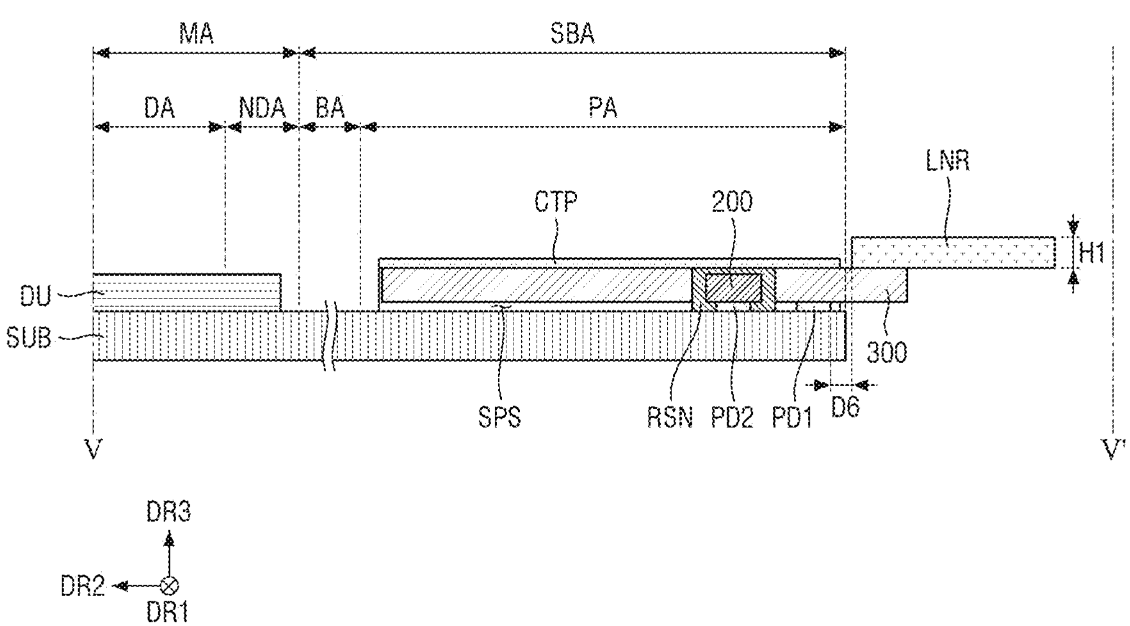
FIG. 16 is a cross-sectional view taken along line V-V' of FIG. 13.
Figure 17:
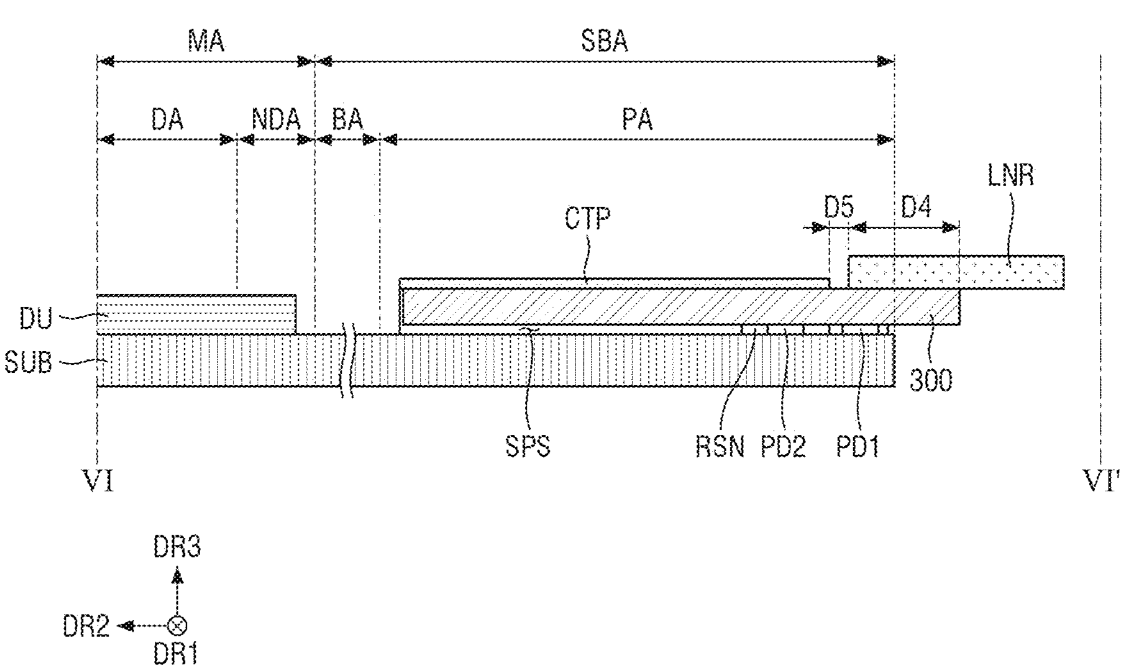
FIG. 17 is a cross-sectional view taken along line VI-VI' of FIG. 13.
Figure 18:
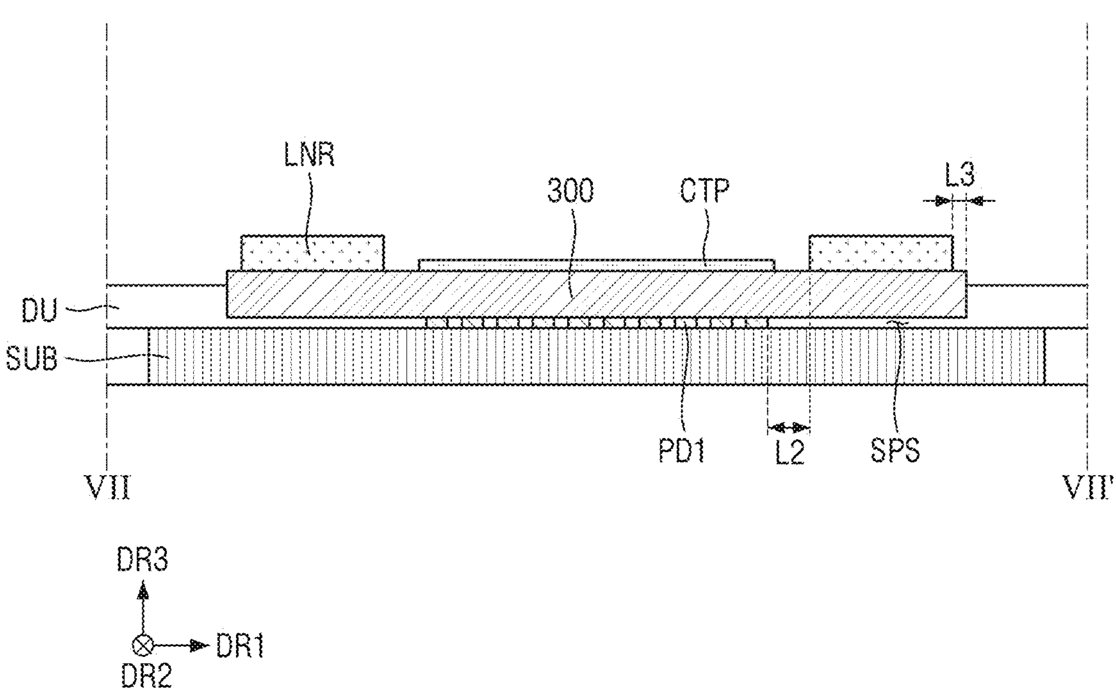
FIG. 18 is a cross-sectional view taken along line VII-VII' of FIG. 13.

FIG. 13 is a plan view illustrating a state in which a liner is attached to the display device according to an embodiment. FIG. 14 is a schematic plan view of a liner according to an embodiment. FIG. 15 is an enlarged plan view of part 'B' of FIG. 13. FIG. 16 is a cross-sectional view taken along line V-V' of FIG. 13. FIG. 17 is a cross-sectional view taken along line VI-VI' of FIG. 13. FIG. 18 is a cross-sectional view taken along line VII-VII' of FIG. 13.

Referring to FIGS. 13 and 14, the liner LNR may include a first portion LNR_PT1 extending in the first direction DR1 and a second portion LNR_PT2 protruding from the first portion LNR_PT1 in the second direction DR2. A boundary RBDR can be between the first portion LNR_PT1 and the second portion LNR_PT2 of the liner LNR.

Most of the first portion LNR_PT1 of the liner LNR may not overlap the pad area PA of the display panel 100. For example, the first portion LNR_PT1 of the liner LNR may be positioned on an opposite side of the main area MA of the display panel 100 with the second portion LNR_PT2 interposed therebetween. The liner LNR may not overlap the pad area PA of the display panel 100, as shown in FIG. 16.

The second portion LNR_PT2 may be configured to be in direct contact with the printed circuit board 300 on the first and second exposure areas EXP1 and EXP2 described above with reference to FIG. 8.

The liner LNR may be attached before the bending process of the display device 10 and detached after the bending process thereof. The residue film RSD may be formed by detaching the second portion LNR_PT2 from the printed circuit board 300 in the first and second exposure areas EXP1 and EXP2.

In some embodiments, the liner LNR may be a release film including an adhesive material on one surface of a base, such as a polyester (PET)-based film. As an example, an adhesive layer including an adhesive material may be disposed on a lower surface of the second portion LNR_PT2. The adhesive layer may include an acrylic-based adhesive material, a silicone-based adhesive material, a urethane-based adhesive material, an olefin-based adhesive material, or a styrene-based adhesive material. In various embodiments, the adhesive layer may include an acrylic-based adhesive material capable of easily adjusting adhesive strength. The adhesive layer may require adhesive strength enough to allow the liner to be attached or detached but to prevent the liner from being detached during the bending process. For example, the adhesive strength of the adhesive layer may be 700 gram force(gf)/inch to 3500 gf/inch, but this is in consideration of a minimum adhesive strength that the liner LNR may withstand pressure during bending and a maximum adhesive strength that may minimize damage to the printed circuit board 300 during detachment, but the adhesive strength of the adhesive layer is not limited thereto.

Referring to FIGS. 13 to 18, an end portion on one side of the second portion LNR_PT2 of the liner LNR in the second direction DR2 may be spaced apart from the end portion on the other side of the printed circuit board 300 in the second direction DR2 by a fourth length D4, as shown in FIG. 15. This is to secure a minimum attachment tolerance distance in which the liner LNR may not be detached during the bending process of the display device 10, and for example, the fourth length D4 may be 5.0 mm or more. The fourth length can determine a minimum surface area for attachment of the adhesive material on the lower surface of the second portion LNR_PT2 of the liner LNR.

The end portion on one side of the second portion LNR_PT2 of the liner LNR may be spaced apart from a boundary between the first cover portion CVR1 and the second cover portion CVR2 of the cover tape CTP by a fifth length D5. This is in consideration of the attachment tolerance of the liner LNR and the attachment tolerance of the cover tape CTP, and for example, the fifth length D5 may be 0.45 mm or more.

A boundary RBDR between the first portion LNR_PT1 and the second portion LNR_PT2 of the liner LNR may be spaced apart from the first pad portion PD1 by a sixth length D6. This is to secure a space for the first pad portion PD1 and to prevent interference between the liner LNR and the cover tape CTP, and for example, the sixth length D6 may be 2.0 mm or more. The fifth length D5 may be less than the sixth length D6, where the second portion LNR_PT2 of the liner LNR can be closer to the first cover portion CVR1 than the first portion LNR_PT1 of the liner LNR is to the second cover portion CVR2 of the cover tape CTP, as shown in FIG. 15.

An end portion of the second portion LNR_PT2 of the liner LNR in the first direction DR1 adjacent to the first pad portion PD1 may be spaced apart from the first pad portion PD1 by a second distance L2. This is to secure a minimum tolerance for preventing the attachment area of the liner LNR from being damaged when heat compression is performed to bond the printed circuit board 300 on the first pad portion PD1, and for example, the second distance L2 may be 1.0 mm or more.

An end portion of the liner LNR in the first direction DR1 may be spaced apart from an end portion of the printed circuit board 300 in the first direction DR1 by a third distance L3. The end portion of the printed circuit board 300 in the first direction DR1 may protrude more than the end portion of the liner LNR in the first direction DR1. This is in consideration of the attachment tolerance of the liner LNR, and the third distance L3 may be 0.3 mm or more.

In an embodiment, a minimum thickness of the liner LNR may be 0.25 mm or more. This is in consideration of the minimum thickness at which the liner LNR may withstand pressure during bending, but the minimum thickness of the liner LNR is not necessarily limited thereto.

In the display device 10 according to the present embodiment, a space to which a vacuum adsorption pad may be attached up to an area that does not overlap the pad area PA of the display panel 100 may be secured by attaching the liner LNR on the printed circuit board 300. The vacuum adsorption pad may be in direct contact with the cover tape and the liner.

Hereinafter, other examples of the display device according to an embodiment will be described. In the following embodiments, the same components as those of the above-described embodiment will be denoted by the same reference numerals, and an overlapping description thereof will be omitted or simplified and differences will be mainly described.

Figure 19:
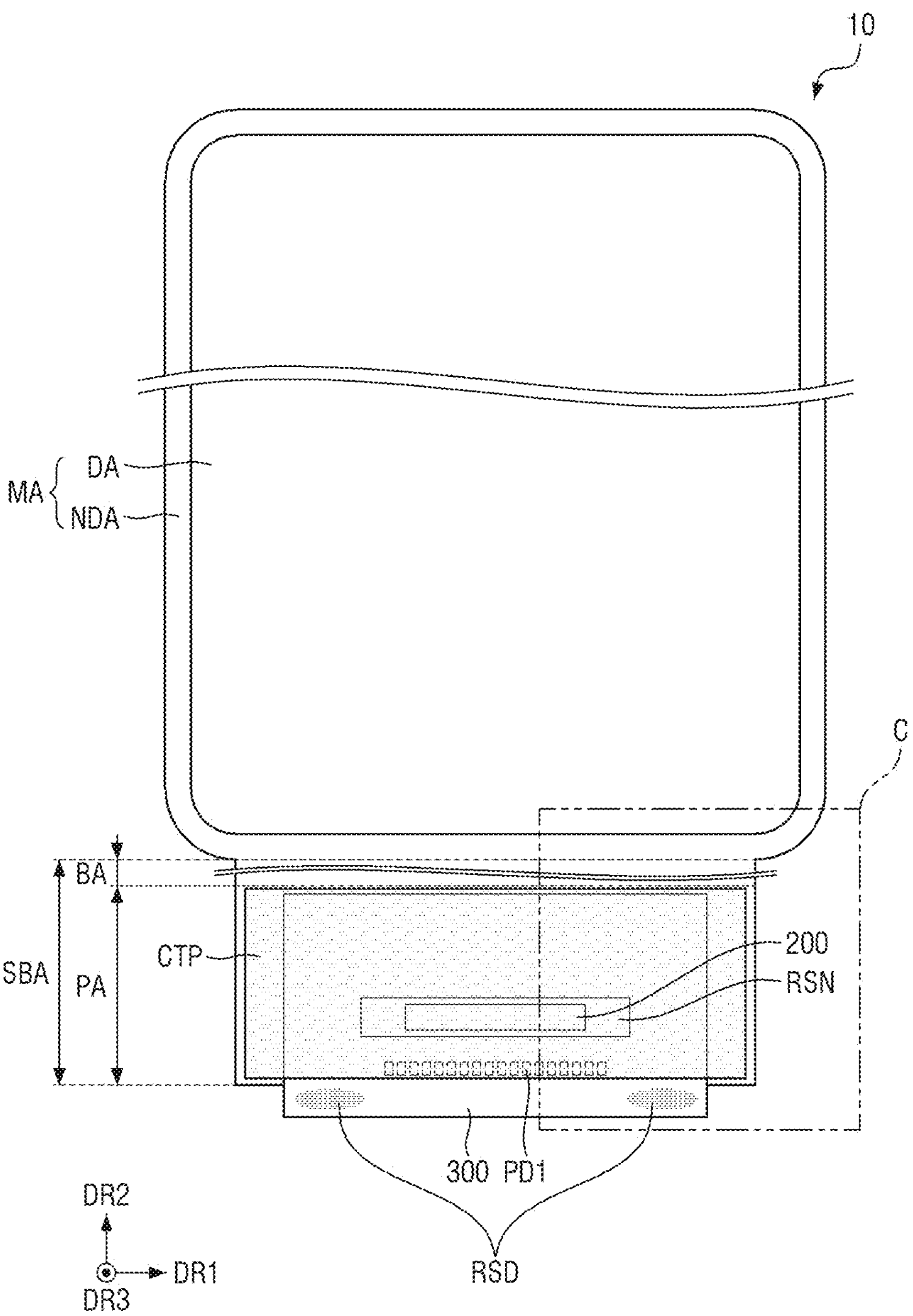
FIG. 19 is a plan view of a display device according to another embodiment viewed from the front.
Figure 20:
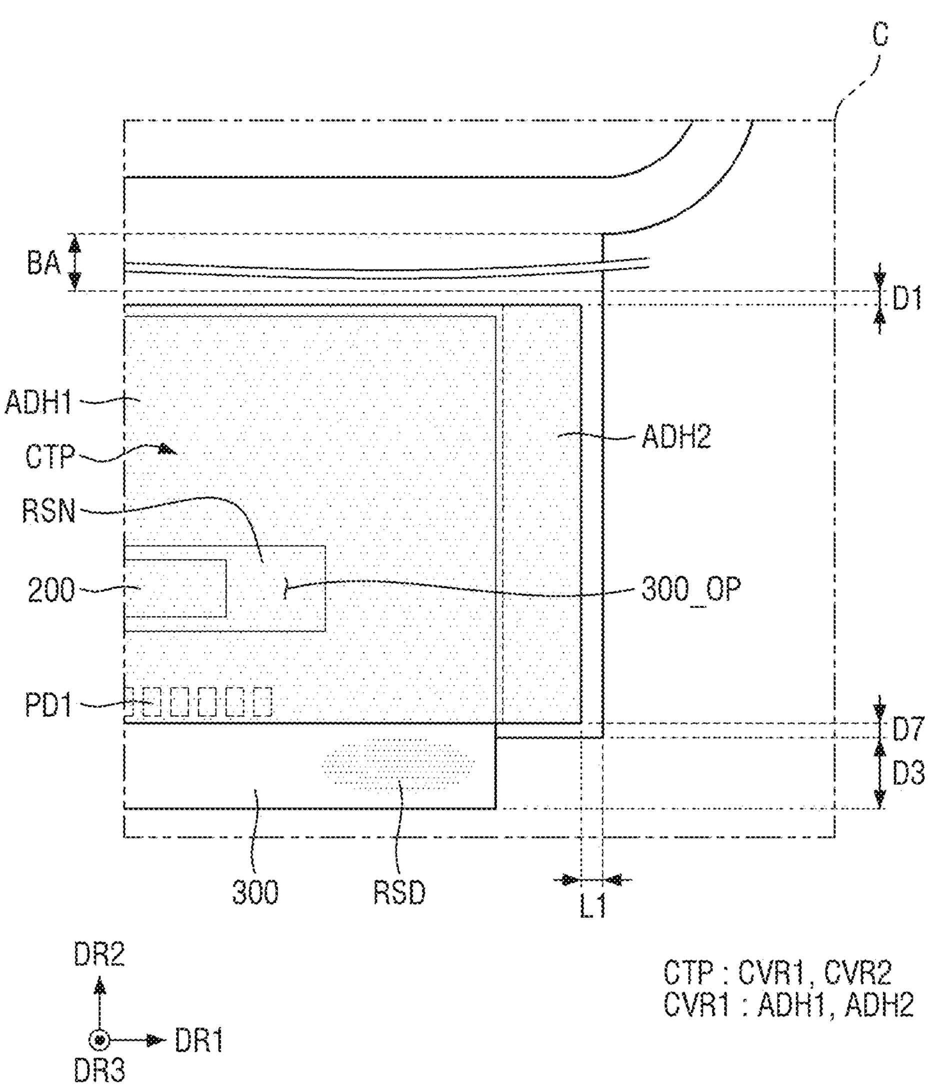
FIG. 20 is an enlarged view of part 'C' of FIG. 19.
Figure 21:
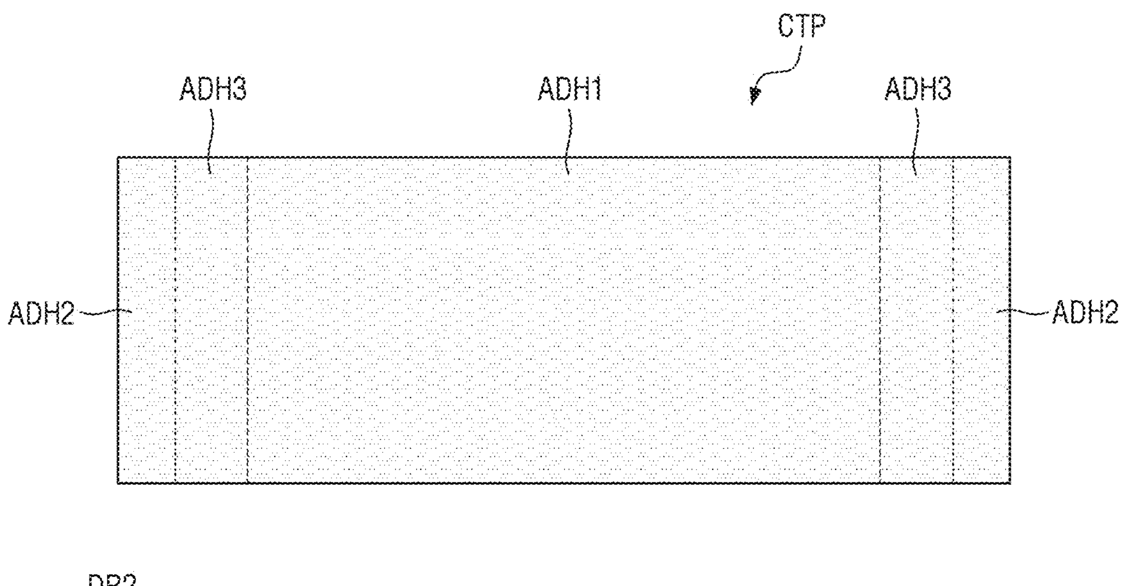
FIG. 21 is a development view of a cover tape according to another embodiment.

FIG. 19 is a plan view of a display device according to another embodiment viewed from the front. FIG. 20 is an enlarged view of part 'C' of FIG. 19. FIG. 21 is a development view of a cover tape according to another embodiment.

Referring to FIGS. 19 to 21, a display device 10 according to another embodiment is different from the display device 10 according to the embodiment described with reference to FIG. 7 and the like in that the cover tape CTP does not include a second cover portion CVR2.

In various embodiments, the cover tape CTP of the display device 10 according to another embodiment may include a first cover portion CVR1 without protrusions from the first cover portion CVR1 in a second direction DR2. The cover tape CTP can have a rectangular shape.

The first cover portion CVR1 may include a first adhesive portion ADH1, second adhesive portions ADH2 disposed on both sides of the first adhesive portion ADH1, and third adhesive portions ADH3 disposed between the first adhesive portion ADH1 and the second adhesive portions ADH2, where the third adhesive portions ADH3 are disposed on both sides of the first adhesive portion ADH1.

Descriptions of the second adhesive portion ADH2 and the third adhesive portion ADH3 are the same as those of the display device 10 according to the embodiment, and thus will be omitted.

The display device 10 according to another embodiment is the same as the display device 10 according to the embodiment in that the first adhesive portion ADH1 may be directly attached to at least a partial area of the upper surface of the printed circuit board 300 and may also be directly attached to the upper surface of the resin layer RSN.

In various embodiments, the first adhesive portion ADH1 of the first cover portion CVR1 may completely cover the first pad portion PD1 instead of the second cover portion CVR2.

As the first adhesive portion ADH1 completely covers the first pad portion PD1, heat generated from the first pad portion PD1 may be effectively diffused. In addition, as an overlapping area of the cover tape CTP with the printed circuit board 300 increases, heat generated from the printed circuit board 300 may be further diffused.

The end portion on one side of the cover tape CTP in the second direction DR2 may be spaced apart from a boundary between the bending area BA and the pad area PA by a first length D1, and the end portion on the other side of the cover tape CTP in the second direction DR2 may be spaced apart from the end portion on the other side of the display panel 100 in the second direction DR2 by a seventh length D7, as shown in FIG. 20. This is in consideration of the attachment tolerance of the cover tape CTP, and for example, the seventh length D7 may be 0.3 mm or more.

Figure 22:
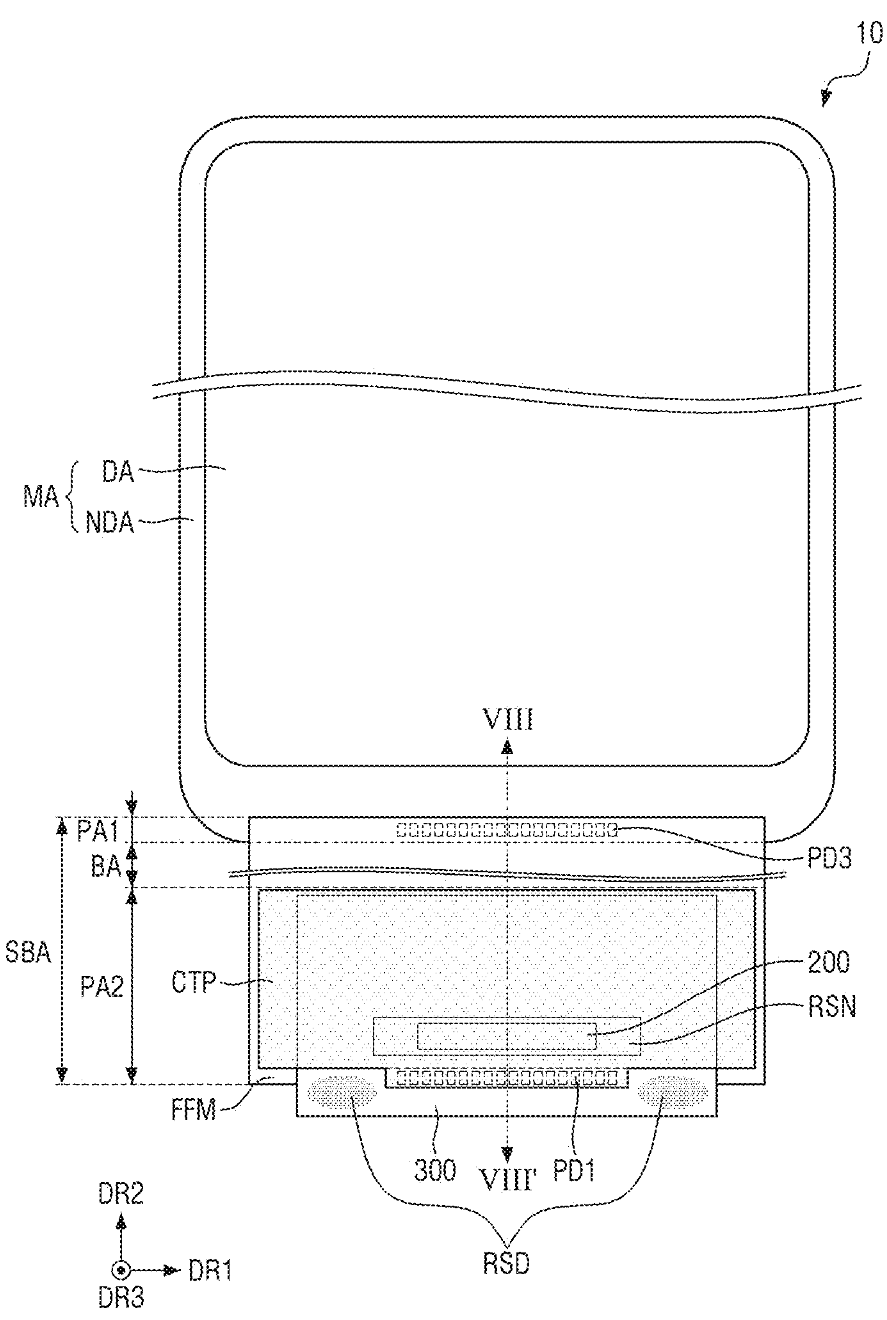
FIG. 22 is a plan view of a display device according to still another embodiment viewed from the front.
Figure 23:
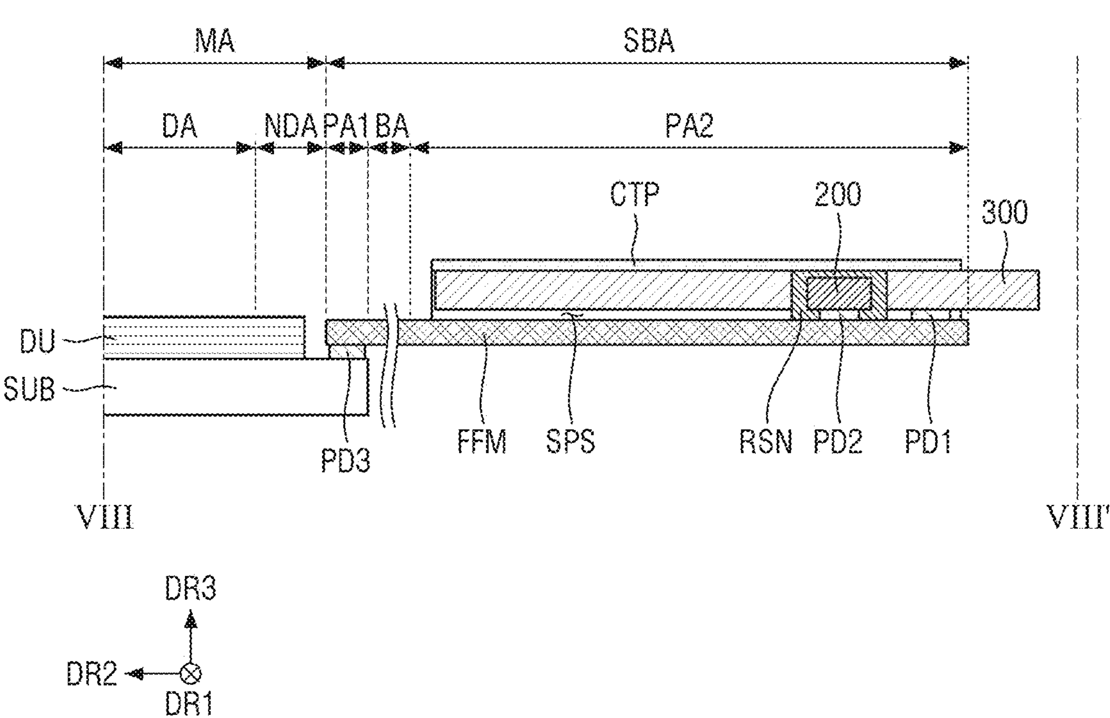
FIG. 23 is a cross-sectional view taken along line VIII-VIII' of FIG. 22.

FIG. 22 is a plan view of a display device according to still another embodiment viewed from the front. FIG. 23 is a cross-sectional view taken along line VIII-VIII' of FIG. 22.

Referring to FIGS. 22 and 23, a display device 10 according to still another embodiment is different from the display device 10 according to the embodiment described with reference to FIG. 7 and the like in that the driving chip 200 and the printed circuit board 300 are mounted on a flexible film FFM instead of the display panel 100.

More specifically, the display device 10 according to still another embodiment may include the display panel 100, the driving chip 200, the printed circuit board 300, the resin layer RSN, and the cover tape CTP, and may further include a flexible film FFM.

The flexible film FFM may be disposed on the display panel 100, where the flexible film FFM may be disposed on the sub-area SBA of the display panel 100. The flexible film FFM may be attached onto the third pad portion PD3 using an anisotropic conductive film (ACF). The flexible film FFM may include a lead line, and the lead line may be electrically connected to the pad portion. The flexible film FFM may be a flexible film such as a flexible printed circuit board, a printed circuit board, or a chip on film.

The flexible film FFM may include a plurality of stacked structures. For example, the flexible film FFM may include a plurality of wiring layers, an insulating layer disposed between the wiring layers, and an organic protective layer disposed on upper and lower sides of the wiring layers.

The display panel 100 may include a main area MA, and the flexible film FFM may include a sub-area SBA.

The sub-area SBA may include a first pad area PA1, a bending area BA, and a second pad area PA2.

The first pad area PA1 may include a third pad portion PD3 connecting the flexible film FFM and the display panel 100. The first pad area PA1 may be disposed on the non-display area NDA.

The bending area BA may be positioned on a side of the main area MA adjacent to the printed circuit board 300 with the first pad area PA1 interposed therebetween. The third pad portion PD3 can be on the non-display area NDA of the main area MA, where the flexible film FFM can be electrically connected to the third pad portion PD3.

The second pad area PA2 may include pad portions connected to the printed circuit board 300 and the driving chip 200, respectively. As an example, the printed circuit board 300 may be connected to the display panel 100 through a first pad portion PD1, and the driving chip 200 may be connected to the display panel 100 through a second pad portion PD2, where the flexible film FFM electrically connects the second pad portion PD2 to the third pad portion PD3 and the display panel 100.

The driving chip 200 and the printed circuit board 300 may be mounted on the flexible film FFM through the second pad portion PD2 and the first pad portion PD1, respectively, as shown in FIG. 23. For example, the driving chip 200 may be mounted in a chip on film (COF) method.

The cover tape CTP may be disposed on the flexible film FFM, the driving chip 200, and the printed circuit board 300, as shown in FIG. 23. The cover tape CTP may at least partially cover each of the flexible film FFM, the driving chip 200, and the printed circuit board 300, where the cover tape can be attached to at least a partial area of the flexible film FFM and at least a partial area of the printed circuit board 300. The cover tape CTP may completely cover the driving chip 200, as shown in FIG. 22.

The second adhesive portion ADH2 of the first cover portion CVR1 of the cover tape CTP may be directly attached to at least a partial area of the upper surface of the flexible film FFM.

The contents of the separation distances D1, D2, D3, and L1 (see FIG. 9) between the boundaries or end portions of each member are the same as those described above with reference to FIGS. 7 to 12, but with respect to the second length D2, the third length D3, and the first distance L1, the separation distance from the display panel 100 may be interpreted as a separation distance from the flexible film FFM.

For example, a boundary CBDR between the first cover portion CVR1 and the second cover portion CVR2 of the cover tape CTP may be spaced apart from an end portion on the other side of the flexible film FFM in the second direction DR2 by the second length D2. An end portion opposite to the end portion of the printed circuit board 300 adjacent to the bending area BA, that is, an end portion on the other side in the second direction DR2 may protrude by the third length D3 compared to the end portion on the other side of the flexible film FFM in the second direction DR2. An end portion of the cover tape CTP in the first direction DR1 may be spaced apart from an end portion of the pad area PA of the flexible film FFM in the first direction DR1 by the first distance L1 in plan view.

A separation space SPS may be formed in an overlapping area in which the printed circuit board 300 overlaps the flexible film FFM positioned on one side of the first pad portion PD1 in the second direction DR2, as shown in FIG. 23. In the overlapping area, the printed circuit board 300 may be configured to be freely physically spaced apart from the flexible film FFM, where there is a gap between the printed circuit board 300 and the flexible film FFM.

As the first adhesive portion ADH1 is attached to the printed circuit board 300 and the second adhesive portions ADH2 are attached to the flexible film FFM, the cover tape CTP according to the present embodiment may prevent the printed circuit board 300 spaced apart from the flexible film FFM in the overlapping area from moving away from the flexible film FFM. Through this, it is possible to prevent the printed circuit board 300 from being separated from the flexible film FFM due to gravity and moment of inertia during a bending process of the display device 10. In addition, damage applied to the first pad portion PD1 may be minimized by preventing the printed circuit board 300 from moving away from the flexible film FFM.

Hereinafter, a method for manufacturing a display device according to an embodiment will be described.

Figure 24:
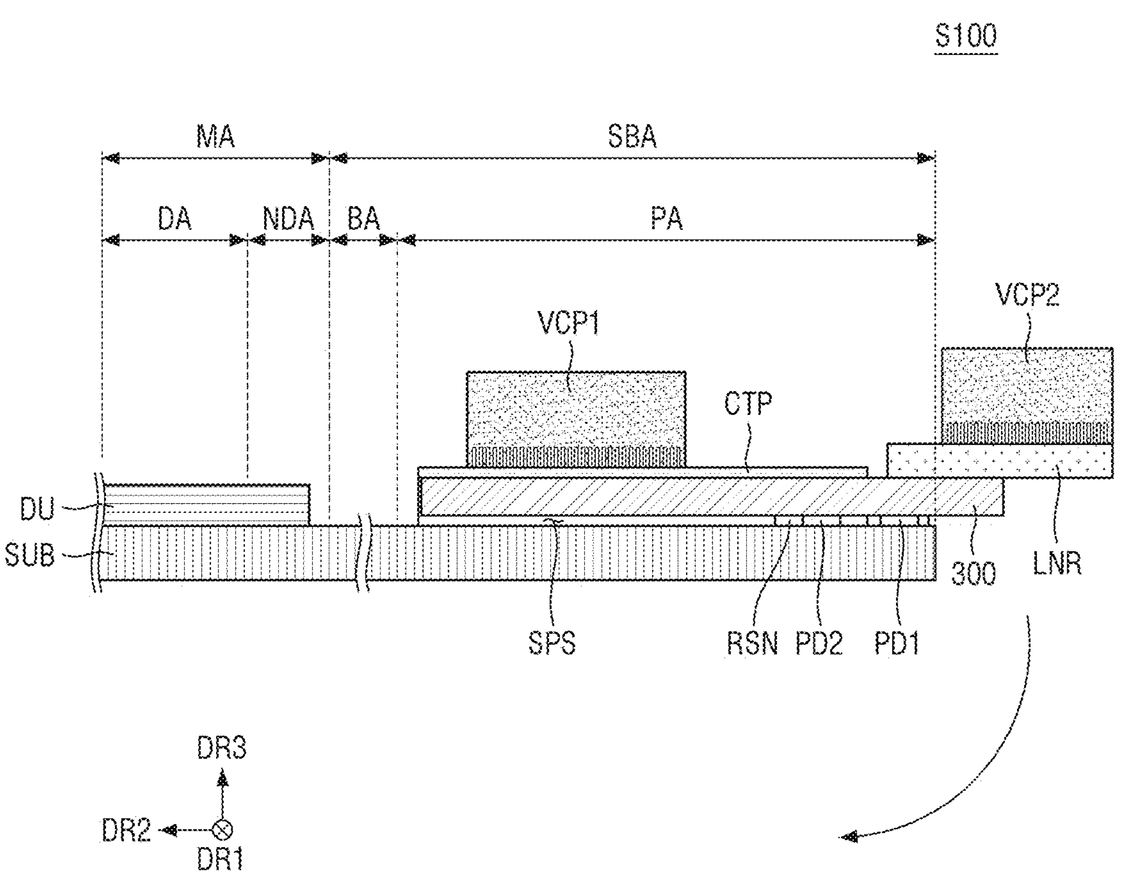
FIGS. 24 and 25 are cross-sectional views illustrating a method for manufacturing a display device according to an embodiment.
Figure 25:
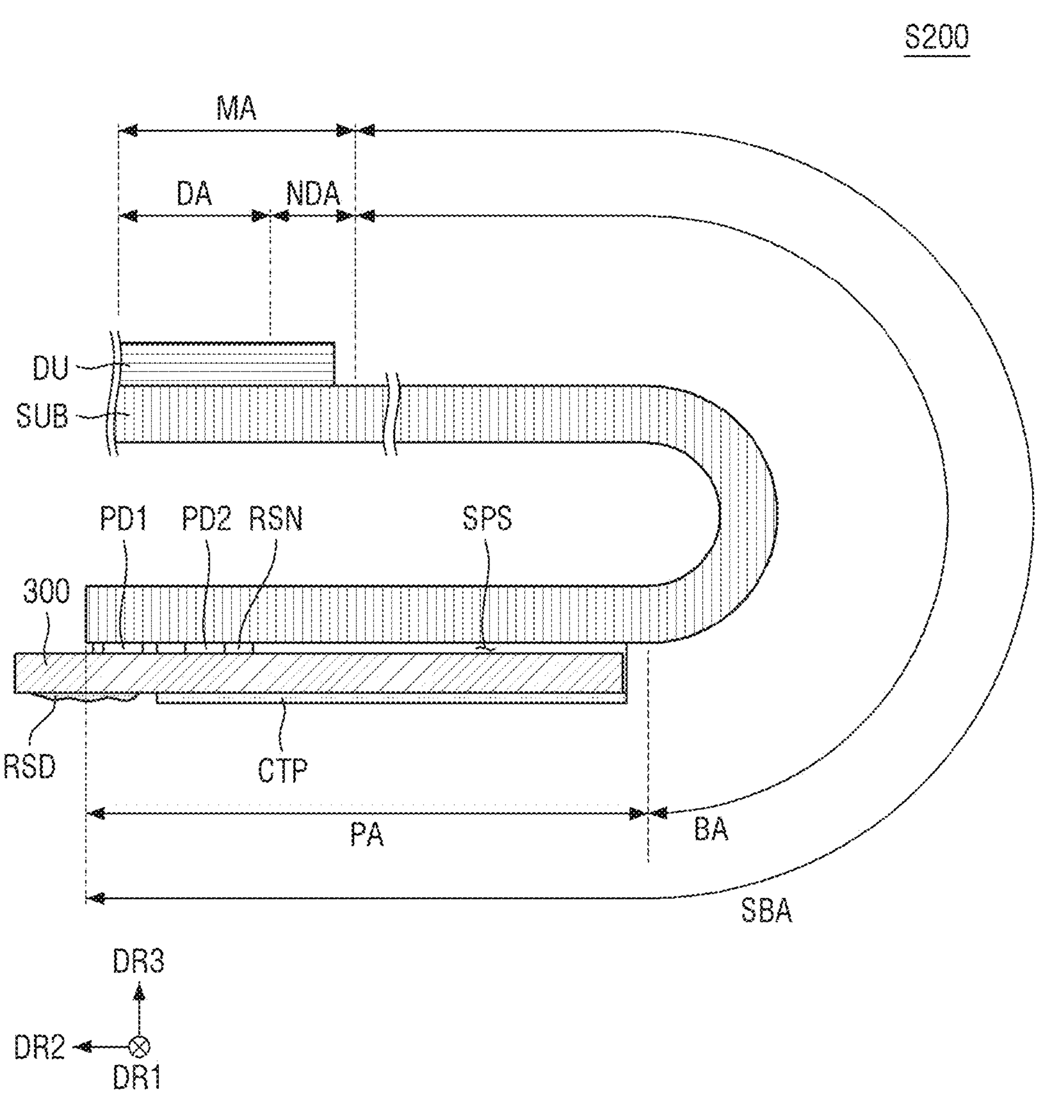

FIGS. 24 and 25 are cross-sectional views illustrating a method for manufacturing a display device according to an embodiment.

Referring to FIGS. 24 and 25, a method for manufacturing a display device may include providing (S100) a display panel on which a driving chip and a printed circuit board 300 including an opening exposing the driving chip are mounted, a cover tape CTP at least partially covering each of the display panel, the driving chip, and the printed circuit board 300, and a liner LNR configured to be attached onto the printed circuit board 300, and bending (S200) the display panel using a vacuum adsorption pad that is in direct contact with the cover tape CTP and the liner LNR (i.e., the release film).

More specifically, in the display device 10 according to an embodiment, a liner LNR may be attached onto the printed circuit board 300 before the bending process. In the bending process, the liner LNR may increase an area to which the vacuum adsorption pad VCP may be attached by an area that does not overlap the pad area PA of the display panel 100. For example, when there is no liner LNR, only the first vacuum adsorption pad VCP1 may be attached onto the cover tape CTP in an area overlapping the pad area PA. On the other hand, in the case of the display device 10 according to the present embodiment, a second vacuum adsorption pad VCP2 may be additionally attached onto the liner LNR, as shown in FIG. 24. Through this, it is possible to secure an adsorption area of the vacuum adsorption pad VCP to minimize a vacuum leak phenomenon.

After the bending process is finished, the liner LNR may be removed from the printed circuit board 300 to secure a mounting space for a battery or a panel lower member, as shown in FIG. 25. The mounting space is a space located on one side of the pad area PA in the second direction, and overlapping the main area in the third direction. In this case, a residue film RSD may be formed on the printed circuit board 300. In the display device 10 according to the present embodiment, as most of the printed circuit board 300 is disposed to overlap the display panel 100, an overlapping length between the sub-area SBA position on the lower side of the display panel 100 and the main area MA positioned on the upper side of the display panel 100 in the third direction DR3 may be minimized. Through this, an area in which the sub-area SBA and the main area MA do not overlap in the third direction DR3 is widened, so that a mounting space of the battery or the panel lower member may be expanded.

Even after the bending of the display device 10 is completed, the cover tape CTP may prevent the printed circuit board 300 from moving away from the display panel 100 in the pad area PA far from the first pad portion PD1. Through this, a phenomenon in which the printed circuit board 300 is detached from the display panel 100 may be prevented, and impact applied to the first pad portion PD1 may be minimized.

Figure 26:
FIG. 26 is an enlarged picture of a residue film of a display device according to an embodiment.
Figure 26:
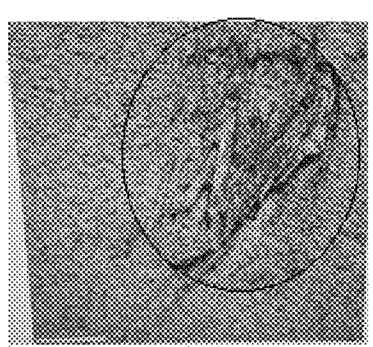

FIG. 26 is an enlarged picture of a residue film of a display device according to an embodiment.

Referring to FIG. 26, left and right pictures of FIG. 26 are pictures illustrating an actual shape of the residue film RSD, respectively.

The residue film RSD may be formed in various forms depending on an adhesive strength of an adhesive, a thickness of an adhesive layer, a direction in which the liner LNR is removed, and a strength of the printed circuit board 300. The shape or texture of the residue film RSD may appear in various forms, and may be generally irregular.

As an example, as illustrated in the left picture, a plurality of residue films RSD may be formed, as indicated by the circled areas. As another example, as illustrated in the right picture, the residue film RSD may be formed in a form of a single physically connected residue. The residue film RSD may include at least one of materials included in the printed circuit board 300, the liner LNR, and the adhesive. In various embodiments, the residue film RSD may include all materials included in the printed circuit board 300, the liner LNR, and the adhesive.

In the bending process and the post process of the display device 10 according to the present embodiment, the adhesive requires an adhesive strength enough to prevent the liner LNR from being detached during bending while being easy to be detached. Accordingly, all of the materials included in the printed circuit board 300, the liner LNR, and the adhesive may remain in the residue film RSD in a state being mixed with each other. The printed circuit board 300 and the liner LNR may be partially detached from an area in which the residue film RSD is formed.

In concluding the detailed description, those skilled in the art will appreciate that many variations and modifications can be made to the preferred embodiments without substantially departing from the principles of the invention. Therefore, the disclosed preferred embodiments of the invention are used in a generic and descriptive sense only and not for purposes of limitation.

The invention claimed is:

1. A display device comprising:

a display panel;

a driving chip attached onto the display panel;

a printed circuit board attached onto the display panel and including an opening exposing the driving chip; and a cover tape at least partially covering each of the display panel, the driving chip, and the printed circuit board.

2. The display device of claim 1, wherein the cover tape is attached to at least a partial area of the display panel and at least a partial area of the printed circuit board.

3. The display device of claim 2, wherein the printed circuit board includes a first area positioned on one side of the opening and a second area positioned on the other side of the opening in a first direction, and the cover tape is attached to at least a portion of the first area and at least a portion of the second area.

4. The display device of claim 3, wherein the cover tape covers the driving chip.

5. The display device of claim 4, wherein the cover tape includes a first cover portion extending in the first direction, and a second cover portion protruding from the first cover portion in a second direction intersecting the first direction, and the printed circuit board includes a first exposure area and a second exposure area on opposite sides of the second cover portion in the first direction, wherein portions of the printed circuit board in the first exposure area and the second exposure area adjacent to the cover tape are exposed.

6. The display device of claim 5, wherein the first cover portion includes a first adhesive portion directly attached to the printed circuit board and a second adhesive portion directly attached to the display panel.

7. The display device of claim 5, wherein an end portion of the display panel protrudes to a side in the second direction compared to a boundary between the first cover portion and the second cover portion.

8. The display device of claim 5, further comprising a residue film disposed on the first exposure area and the second exposure area.

9. The display device of claim 8, wherein the residue film is formed by detaching a liner configured to be attached onto the printed circuit board.

10. The display device of claim 9, wherein the liner includes a first portion extending in the first direction and a second portion protruding from the first portion in the second direction, and the second portion is configured to be in direct contact with the printed circuit board on the first exposure area and the second exposure area.

11. The display device of claim 1, further comprising a resin layer disposed within the opening to surround upper and side surfaces of the driving chip, wherein an upper surface of the resin layer covers the upper surface of the driving chip, and is coplanar with an upper surface of the printed circuit board.

12. The display device of claim 1, wherein the display panel further includes a first pad portion extending in a first direction and connected to the printed circuit board, and the printed circuit board is configured to be spaced apart from the display panel in an overlapping area overlapping the display panel on one side of the first pad portion with respect to a second direction intersecting the first direction.

13. The display device of claim 12, wherein an end portion of the printed circuit board protrudes more than an end portion of the display panel in the second direction.

14. The display device of claim 13, wherein the display panel includes a bending area and a pad area disposed on one side of the bending area and including the first pad portion, and an end portion on one side of the cover tape in the second direction is positioned on the pad area.

15. An electronic device comprising:

a display panel;

a flexible film attached onto the display panel;

a driving chip attached onto the flexible film;

a printed circuit board attached onto the flexible film and including an opening exposing the driving chip; and a cover tape at least partially covering each of the flexible film, the driving chip, and the printed circuit board, wherein the cover tape is attached to at least a partial area of the flexible film or at least a partial area of the printed circuit board.

16. The electronic device of claim 15, wherein the printed circuit board includes a first area positioned on one side of the opening and a second area positioned on the other side of the opening in a first direction, and the cover tape is attached to at least a portion of the first area and at least a portion of the second area.

17. The electronic device of claim 16, wherein the cover tape includes a first cover portion extending in the first direction, and a second cover portion protruding from the first cover portion in a second direction intersecting the first direction, the printed circuit board includes a first exposure area and a second exposure area disposed on one side and the other side of the second cover portion in the first direction, respectively, and not covered by the cover tape, and the first exposure area and the second exposure area are disposed adjacent to the first cover portion in the second direction, respectively.

18. The electronic device of claim 17, wherein the first cover portion includes a first adhesive portion directly attached to the printed circuit board and a second adhesive portion directly attached to the flexible film, and an end portion on one side of the flexible film in the second direction protrudes more than a boundary between the first cover portion and the second cover portion.

19. The electronic device of claim 18, further comprising a residue film disposed on the first exposure area and the second exposure area, wherein the residue film is formed by detaching a liner configured to be attached onto the printed circuit board.

20. A method for manufacturing a display device, the method comprising:

providing a display panel on which a driving chip and a printed circuit board including an opening exposing the driving chip are mounted, a cover tape at least partially covering each of the display panel, the driving chip, and the printed circuit board, and a liner configured to be attached onto the printed circuit board; and bending the display panel using a vacuum adsorption pad that is in direct contact with the cover tape and the liner.

* * * * *